(12) United States Patent
Ellis-Monaghan et al.

(10) Patent No.: US 9,461,090 B2
(45) Date of Patent: Oct. 4, 2016

(54) PHOTODETECTOR AND METHOD OF FORMING THE PHOTODETECTOR ON STACKED TRENCH ISOLATION REGIONS

(71) Applicant: GLOBALFOUNDRIES U.S. 2 LLC, Hopewell Junction, NY (US)

(72) Inventors: John J. Ellis-Monaghan, Grand Isle, VT (US); Qizhi Liu, Lexington, MA (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 35 days.

(21) Appl. No.: 14/323,164

(22) Filed: Jul. 3, 2014

(65) Prior Publication Data

US 2016/0005775 A1    Jan. 7, 2016

(51) Int. Cl.
*H01L 27/146* (2006.01)
*H01L 21/762* (2006.01)

(52) U.S. Cl.
CPC ... *H01L 27/14687* (2013.01); *H01L 21/76283* (2013.01)

(58) Field of Classification Search
None
See application file for complete search history.

(56) References Cited

U.S. PATENT DOCUMENTS

| | | |
|---|---|---|
| 7,262,117 B1 | 8/2007 | Gunn, III et al. |
| 7,616,904 B1 | 11/2009 | Gunn, III et al. |
| 8,148,794 B2 | 4/2012 | Masini et al. |
| 8,257,997 B2 | 9/2012 | Chen et al. |
| 8,304,272 B2 | 11/2012 | Assefa et al. |
| 8,435,809 B2 | 5/2013 | Heck et al. |
| 2010/0006961 A1 | 1/2010 | Yasaitis et al. |
| 2010/0102412 A1 | 4/2010 | Suh et al. |
| 2011/0027950 A1 | 2/2011 | Jones et al. |
| 2011/0143482 A1 | 6/2011 | Assefa et al. |

(Continued)

FOREIGN PATENT DOCUMENTS

| | | |
|---|---|---|
| EP | 2523026 A1 | 11/2012 |
| WO | 2008080428 A1 | 7/2008 |

OTHER PUBLICATIONS

Jay Mathews et al. "Extended Performance GeSn/Si(100) p-i-n Photodetectors for Full Spectral Range Telecommunication Applications", Applied Physics Letters 95, 133506, 2009, pp. 1-3.

(Continued)

*Primary Examiner* — Mary Wilczewski
*Assistant Examiner* — Erik T Peterson
(74) *Attorney, Agent, or Firm* — Gibb & Riley, LLC; Michael J. LeStrange, Esq.

(57) ABSTRACT

Disclosed are structures and methods of forming the structures so as to have a photodetector isolated from a substrate by stacked trench isolation regions. In one structure, a first trench isolation region is in and at the top surface of a substrate and a second trench isolation region is in the substrate below the first. A photodetector is on the substrate aligned above the first and second trench isolation regions. In another structure, a semiconductor layer is on an insulator layer and laterally surrounded by a first trench isolation region. A second trench isolation region is in and at the top surface of a substrate below the insulator layer and first trench isolation region. A photodetector is on the semiconductor layer and extends laterally onto the first trench isolation region. The stacked trench isolation regions provide sufficient isolation below the photodetector to allow for direct coupling with an off-chip optical fiber.

16 Claims, 24 Drawing Sheets

(56) References Cited

U.S. PATENT DOCUMENTS

| | | |
|---|---|---|
| 2012/0135566 A1 | 5/2012 | Pinguet et al. |
| 2012/0288971 A1 | 11/2012 | Bogaerts et al. |
| 2013/0039614 A1 | 2/2013 | Shubin et al. |
| 2014/0080269 A1 | 3/2014 | Assefa et al. |

OTHER PUBLICATIONS

Liu et al. "Silicon Waveguide on Bulk Silicon Substrate and Methods of Forming", U.S. Appl. No. 14/176,552, filed Feb. 10, 2014, 28 pages.

Yin et al., "40Gb/s Ge-on-SOI Waveguide Photodetectors by Selective Ge Growth", OFR/NFOEC, IEEE, 2008, pp. 1-3.

Koester et al., "Ge-on-SOI-Detector/Si-CMOS-Amplifier Receivers for High-Performance Optical-Communication Applications", Journal of Lightwave Technology, vol. 25, No. 1, 2007, pp. 46-57.

Filed Feb. 10, 2014, U.S. Appl. No. 14/176,552 Title: Silicon Waveguide on Bulk Silicon Substrate and Methods of Forming.

Filed Jun. 13, 2014, U.S. Appl. No. 14/304,318 Title:Silicon Waveguide Structure With Arbitrary Geometry on Bulk Silicon Substrate, Related Systems and Program Products.

Filed May 15, 2014, U.S. Appl. No. 14/278,689, Title:Waveguide Devices With Supporting Anchors.

PHOTODETECTOR AND METHOD OF FORMING THE PHOTODETECTOR ON STACKED TRENCH ISOLATION REGIONS

BACKGROUND

The structures and methods disclosed herein relate to photodetectors and, more particularly, to a semiconductor structure comprising a photodetector on stacked trench isolation regions that prevent optical signal loss through a semiconductor substrate below and a method of forming the semiconductor structure.

Generally, in optoelectronics and, particularly, in optoelectronic integrated circuits, on-chip photodetectors (also referred to herein as photosensors or optical receivers) capture optical signals from other on-chip optical devices, such as optical waveguides, and convert the optical signals into electronic signals. In such optoelectronic integrated circuits, oftentimes silicon is used as the core material for optical waveguides because it is transparent to optical signals in the infrared wavelength bands and germanium is used for photodetectors because it absorbs optical signals in those same infrared wavelength bands. While photodetectors are useful in capturing optical signals from on-chip optical devices, they typically are not used to capture optical signals directly from off-chip optical devices, such as optical fibers, because of optical signal loss into the semiconductor substrate at the edge of a chip where direct coupling with the off-chip optical would occur. This is the case when a photodetector is formed on a bulk semiconductor wafer as well as when a photodetector is formed on a relatively thin insulator layer of a semiconductor-on-insulator (SOI) wafer.

SUMMARY

In view of the foregoing, disclosed herein are semiconductor structures and methods of forming the semiconductor structures. The semiconductor structures each have a photodetector that is optically and electrically isolated from a semiconductor substrate below by stacked trench isolation regions. Specifically, one semiconductor structure can comprise a first trench isolation region in and at the top surface of a bulk semiconductor substrate and a second trench isolation region in the substrate below the first trench isolation region. A photodetector can be on the top surface of the semiconductor substrate aligned above the first and second trench isolation regions. Another semiconductor structure can comprise a semiconductor layer on an insulator layer and laterally surrounded by a first trench isolation region. Additionally, a second trench isolation region can be in a semiconductor substrate below the first trench isolation region and insulator layer. A photodetector can be on the semiconductor layer and can extend laterally onto the first trench isolation region. In each of these semiconductor structures, the first and second trench isolation regions (i.e., the stacked trench isolations) can provide sufficient isolation below the photodetector to allow for direct coupling with an off-chip optical device (e.g., optical fiber) with minimal optical signal loss through semiconductor substrate.

More particularly, disclosed herein is a semiconductor structure formed on a bulk semiconductor wafer and comprising a photodetector on stacked trench isolation regions. Specifically, this semiconductor structure can comprise a semiconductor substrate, having a top surface, and a first trench isolation region in the semiconductor substrate at the top surface. The first trench isolation region can have a first opening that extends vertically there through. The semiconductor structure can further comprise a photodetector above the first opening and extending laterally onto the first trench isolation region. The semiconductor structure can further comprise a second trench isolation region in the semiconductor substrate aligned below the photodetector and first trench isolation region. It should be noted that the first opening can be filled with an isolation material. Alternatively, the first opening can have an upper portion immediately adjacent to the photodetector and filled with a semiconductor material and a lower portion immediately adjacent to the second trench isolation region and filled with an isolation material.

Also disclosed herein is semiconductor structure formed on a semiconductor-on-insulator (SOI) wafer and comprising a photodetector above stacked trench isolation regions. Specifically, this semiconductor structure can comprise a semiconductor substrate and an insulator layer on the top surface of the semiconductor substrate. This semiconductor structure can further comprise both a first trench isolation region and a semiconductor layer on the insulator layer. The first trench isolation region can have first opening extending vertically there through and the semiconductor layer can be positioned within the first opening such that the first trench isolation region laterally surrounds the semiconductor layer. The semiconductor structure can further comprise a photodetector on the semiconductor layer (i.e., above the first opening) and further extending laterally onto the first trench isolation region. The semiconductor structure can further comprise a second trench isolation region in and at the top surface of the semiconductor substrate such that it is immediately adjacent to the insulator layer and further aligned below the photodetector and first trench isolation region.

In each of the above-described semiconductor structures, the photodetector can have a first end and a second end opposite the first end. An antireflective spacer can be positioned laterally immediately adjacent to the first end of the photodetector. An optical fiber can be positioned in end-to-end alignment with the first end of the photodetector. Specifically, an edge of the semiconductor substrate can extend laterally beyond the first end of the photodetector and further beyond the antireflective spacer. The optical fiber can be positioned on this edge such that the antireflective spacer is positioned laterally between the optical fiber and the first end of the photodetector. Such an optical fiber can transmit optical signals to the photodetector and, during transmission of these optical signals, the isolation material that is below the photodetector (i.e., the stacked trench isolation regions, including the first trench isolation region and the second trench isolation region, as well as the insulator layer, if applicable) can prevent loss of the optical signals into the semiconductor substrate.

Also disclosed herein is a method of forming, on a bulk semiconductor wafer, a semiconductor structure comprising a photodetector on stacked trench isolation regions. That is, the method can comprise providing a bulk semiconductor wafer comprising a semiconductor substrate having a top surface.

The method can further comprise forming a first trench isolation region in the semiconductor substrate at the top surface. Specifically, the method can comprise forming a first trench at the top surface of the semiconductor substrate and filling the first trench with a first isolation material in order to form a first trench isolation region. It should be noted that the first trench should be formed (e.g., patterned and etched) such that the resulting first trench isolation region has a first opening and such that a portion of the semiconductor substrate is within the first opening laterally surrounded by the first trench isolation region.

This method can further comprise forming a photodetector on the portion of the semiconductor substrate within the first opening. After forming the photodetector, a dielectric layer can be formed such that it covers the photodetector and further extends laterally onto the first trench isolation region.

Then, a second trench isolation region can be formed in the semiconductor substrate aligned below the photodetector and the first trench isolation region. Specifically, a plurality of second openings can be formed such that they extend vertically through the dielectric layer and the first trench isolation region into the semiconductor substrate and further such that they are positioned adjacent to multiple sides of the photodetector. Once the second openings are formed, exposed surfaces of the semiconductor substrate in the second openings can be etched in order to form a second trench in the semiconductor substrate below the first trench isolation region. This second trench can then be filled with a second isolation material so as to form the second trench isolation region.

It should be noted that, during the etch process used to form the second trench, the portion of the semiconductor substrate within the first opening in the first trench isolation can be etched from below. Thus, the process of filling the second trench with the second isolation material can also result in the first opening being at least partially filled with the second isolation material. That is, if all of the semiconductor material within the first opening is etched out, the first opening may subsequently be filled with the second isolation material. Alternatively, if only the semiconductor material within the lower portion of the first opening is etched out, only the lower portion of the first opening will be filled with the second isolation material and the upper portion will remain filled with semiconductor material.

Also disclosed herein is a method of forming, on a semiconductor-on-insulator (SOI) wafer, a semiconductor structure with a photodetector on stacked trench isolation regions. Specifically, this method can comprise providing semiconductor-on-insulator (SOI) wafer comprising a semiconductor substrate, an insulator layer on the top surface of the semiconductor substrate, and a semiconductor layer on the insulator layer.

The method can further comprise forming a first trench isolation region in the semiconductor layer. Specifically, the method can comprise forming a first trench in the semiconductor layer and filling the first trench with a first isolation material in order to form a first trench isolation region. It should be noted that the first trench should be formed (e.g., patterned and etched) such that the resulting first trench isolation region has a first opening and such that a portion of the semiconductor layer is within the first opening laterally surrounded by the first trench isolation region.

This method can further comprise forming a photodetector on the portion of the semiconductor layer within the first opening. After forming the photodetector, a dielectric layer can be formed such that it covers the photodetector and further extends laterally onto the first trench isolation region.

Then, a second trench isolation region can be formed in the semiconductor substrate below the insulator layer such that it is aligned below the photodetector and the first trench isolation region. Specifically, a plurality of second openings can be formed such that they extend vertically through the dielectric layer, the first trench isolation region and the insulator layer into the semiconductor substrate and further such that they are positioned adjacent to multiple sides of the photodetector. Once the second openings are formed, exposed surfaces of the semiconductor substrate in the second openings can be etched in order to form a second trench in the semiconductor substrate below the insulator layer and, specifically, aligned below the photodetector and the first trench isolation region. This second trench can then be filled with a second isolation material so as to form the second trench isolation region.

In each of the above-described methods, the photodetector can have a first end and a second end opposite the first end. An antireflective spacer can be formed so that it is positioned laterally immediately adjacent to the first end of the photodetector. An optical fiber can also be positioned such that it is in end-to-end alignment with the first end of the photodetector. Specifically, an edge of the semiconductor substrate can extend laterally beyond the first end of the photodetector and further beyond the antireflective spacer. The optical fiber can be positioned on this edge such that the antireflective spacer is positioned laterally between the optical fiber and the first end of the photodetector. Such an optical fiber can transmit optical signals to the photodetector and, during transmission of these optical signals, the isolation material that is below the photodetector (i.e., the stacked trench isolation regions, including the first trench isolation region and the second trench isolation region, as well as the insulator layer, if applicable) can prevent loss of the optical signals into the semiconductor substrate.

BRIEF DESCRIPTION OF THE SEVERAL VIEWS OF THE DRAWINGS

The embodiments herein will be better understood from the following detailed description with reference to the drawings, which are not necessarily drawn to scale and in which.

DETAILED DESCRIPTION

As mentioned above, in optoelectronics and, particularly, in optoelectronic integrated circuits, on-chip photodetectors (also referred to herein as photosensors or optical receivers) capture optical signals from other on-chip optical devices, such as optical waveguides, and convert the optical signals into electronic signals. In such optoelectronic integrated circuits, oftentimes silicon is used as the core material for optical waveguides because it is transparent to optical signals in the infrared wavelength bands and germanium is used for photodetectors because it absorbs optical signals in those same infrared wavelength bands. While photodetectors are useful in capturing optical signals from on-chip optical devices, they typically are not used to capture optical signals directly from off-chip optical devices, such as optical fibers, because of optical signal loss into the semiconductor substrate at the edge of a chip where direct coupling with the off-chip optical would occur. This is the case when a photodetector is formed on a bulk semiconductor wafer as well as when a photodetector is formed on a relatively thin insulator layer of a semiconductor-on-insulator (SOI) wafer.

In view of the foregoing, disclosed herein are semiconductor structures and methods of forming the semiconductor structures. The semiconductor structures each have a photodetector that is optically and electrically isolated from a semiconductor substrate below by stacked trench isolation regions. Specifically, one semiconductor structure can comprise a first trench isolation region in and at the top surface of a bulk semiconductor substrate and a second trench isolation region in the substrate below the first trench isolation region. A photodetector can be on the top surface of the semiconductor substrate aligned above the first and second trench isolation regions. Another semiconductor structure can comprise a semiconductor layer on an insulator layer and laterally surrounded by a first trench isolation region. Additionally, a second trench isolation region can be in a semiconductor substrate below the first trench isolation region and insulator layer. A photodetector can be on the semiconductor layer and can extend laterally onto the first trench isolation region. In each of these semiconductor structures, the first and second trench isolation regions (i.e., the stacked trench isolations) can provide sufficient isolation below the photodetector to allow for direct coupling with an off-chip optical device (e.g., optical fiber) with minimal optical signal loss through semiconductor substrate.

Figure 1A:
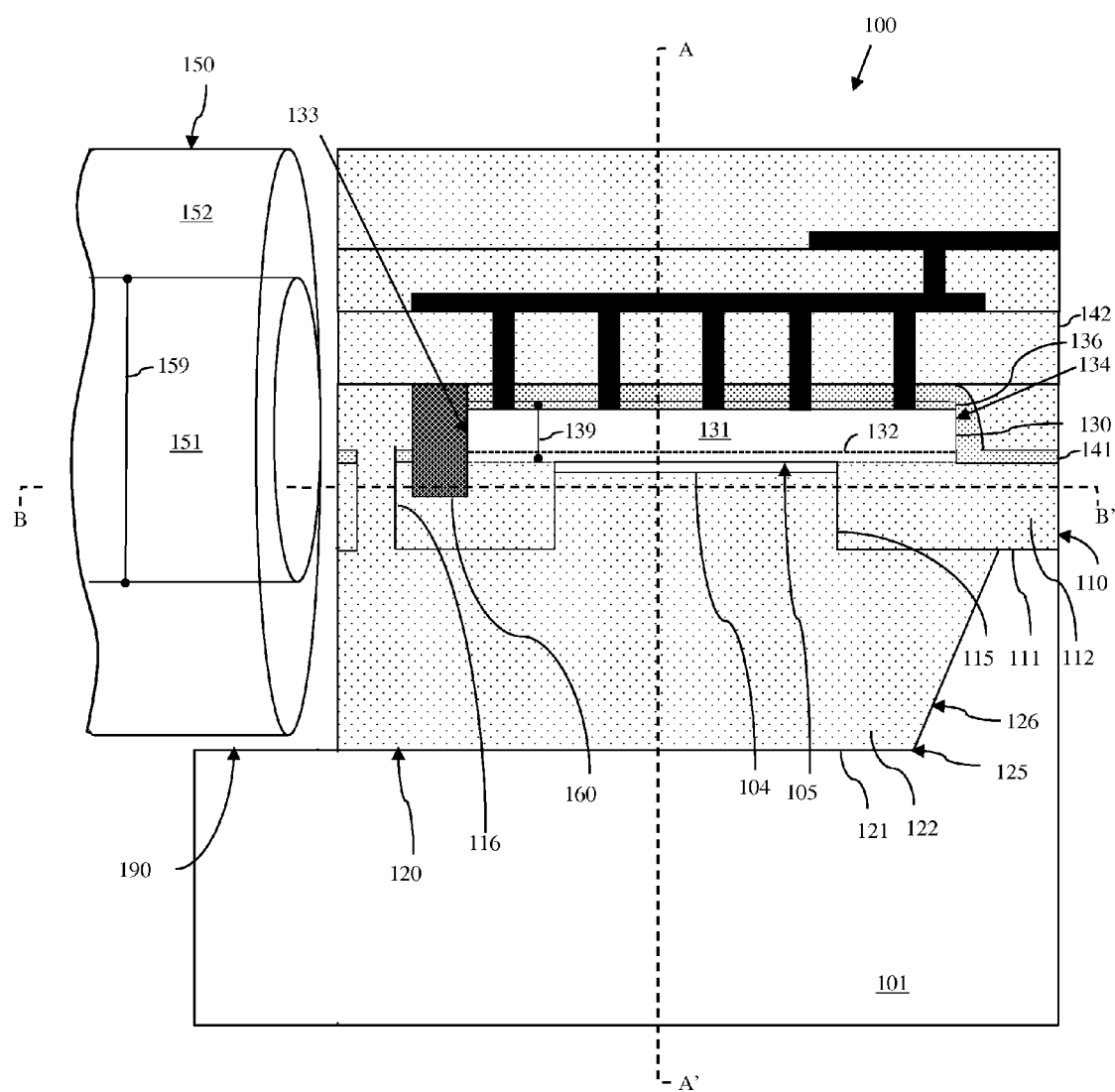
FIG. 1A is a cross-section illustration of a semiconductor structure, which is formed on a bulk semiconductor substrate and which has a photodetector above stacked trench isolation regions.
Figure 1B:
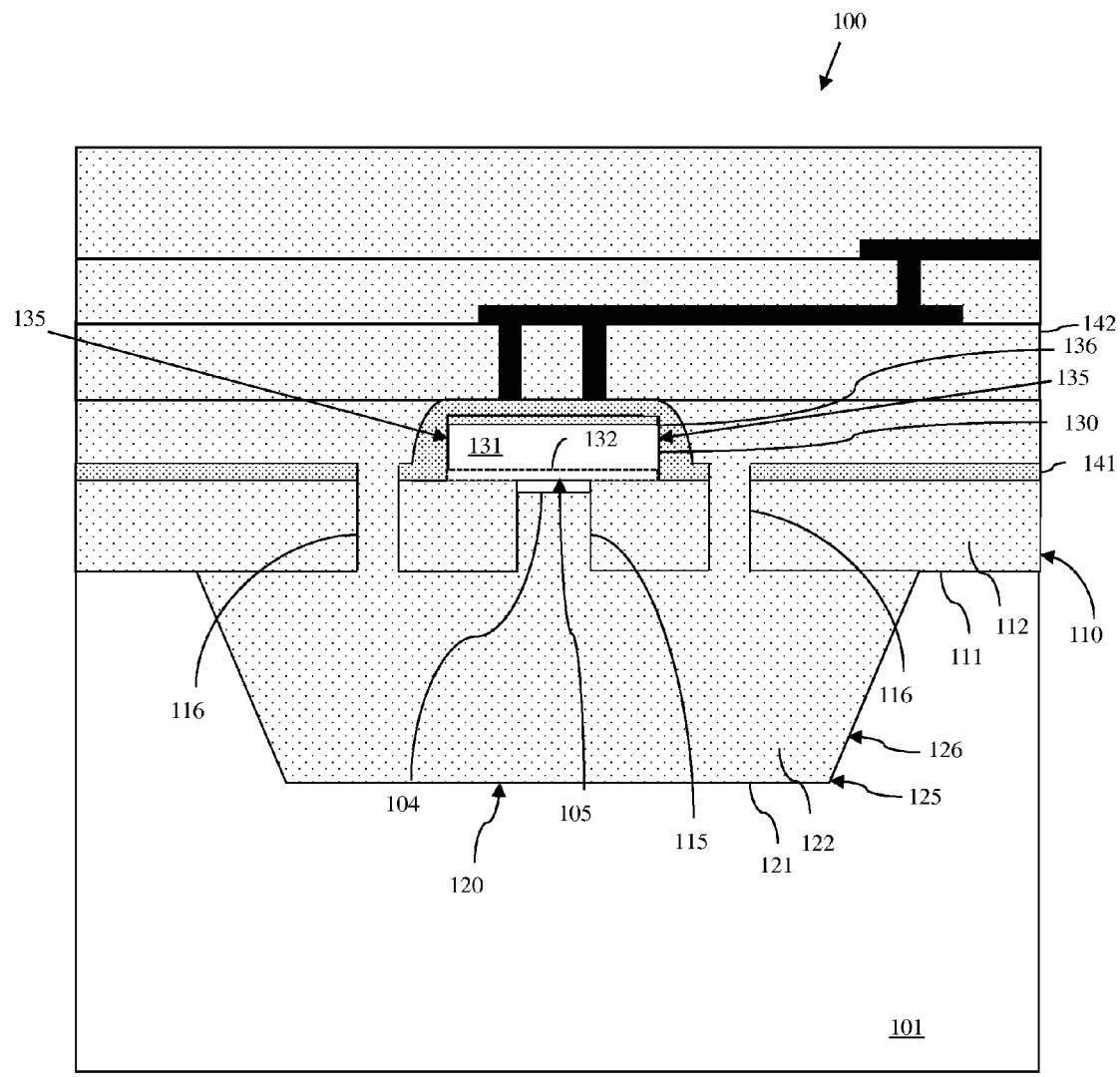
FIG. 1B is another cross-section illustration of the semiconductor structure of FIG. 1A.
Figure 1C:
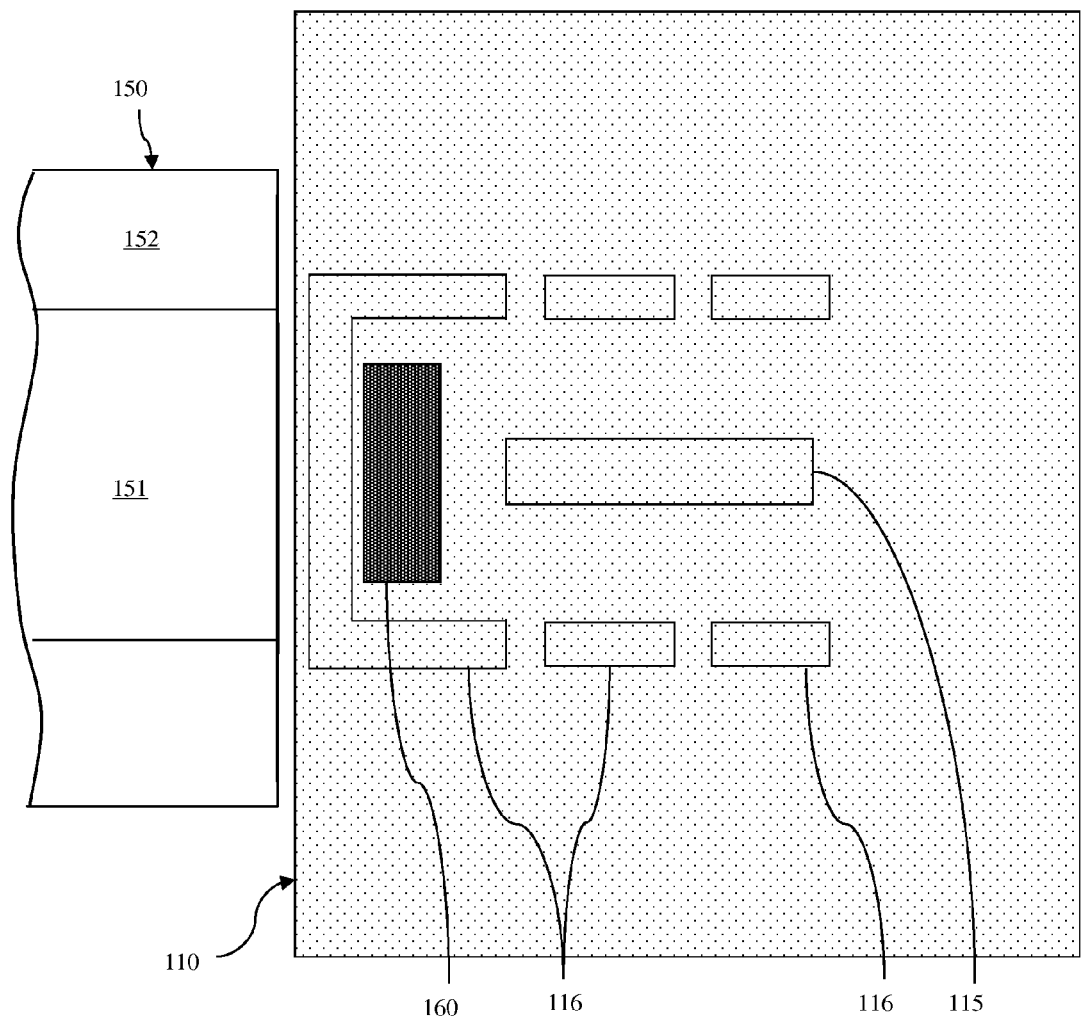
FIG. 1C is yet another cross-section illustration of the semiconductor structure of FIG. 1A.

More particularly, FIGS. 1A-1C in combination illustrate a semiconductor structure 100 formed on a bulk semiconductor wafer and comprising a photodetector 130 on stacked trench isolation regions (i.e., see first trench isolation region 110 above the second trench isolation region 120). FIG. 1A is a cross-section illustration of the semiconductor structure 100 through a vertical plane, which cuts across the length of the structure. FIG. 1B is another cross-section illustration through a different vertical plane A-A', which, as shown in FIG. 1A, cuts across the width of the structure. FIG. 1C is yet another cross-section illustration of the semiconductor structure 100 through a horizontal plane B-B', which, as shown in FIG. 1A, cuts across the semiconductor substrate near the top surface.

Specifically, referring to FIGS. 1A-1C, the semiconductor structure 100 can comprise a semiconductor substrate 101 having a top surface 105. This semiconductor substrate 101 can comprise, for example, a silicon substrate or other suitable semiconductor substrate.

The semiconductor structure 100 can further comprise a first trench isolation region 110 in the semiconductor substrate 101 at the top surface 105. The first trench isolation region 110 can comprise a first trench 111 and the first trench 111 can be filled with one or more first isolation materials 112 (e.g., silicon dioxide, silicon nitride, silicon oxynitride, and/or any other suitable isolation material). As discussed in greater detail below with regard to the method of forming this semiconductor structure 100, the first trench 111 can be patterned and etched such that the resulting first trench isolation region 110 has a first opening 115 that extends vertically there through. This first opening 115 can, for example, be an essentially rectangular-shaped first opening.

The semiconductor structure 100 can further comprise a photodetector 130 aligned above the first opening 115 in the first trench isolation region 110. This photodetector 130 can, for example, have the same shape as the first opening 115 (e.g., can have an essentially rectangular shape) and can be slightly larger than the first opening 115 such that it extends laterally onto the first trench isolation region 110. The photodetector 130 can have a first end 133, a second end 134 opposite the first end 133, and opposing sides 135. The photodetector 130 can comprise a light-absorbing layer 131. This light-absorbing layer 131 can absorb light (i.e., optical signals or photons) within predetermined wavelength bands. For example, this light-absorbing layer 131 can comprise a germanium layer (e.g., an epitaxial germanium layer) that absorbs light (i.e., optical signals or photons) in the infrared wavelength bands (i.e., wavelengths ($\lambda$) in the range of approximately 1.2μ to 1.7μ). The germanium layer can be doped so as to have N-type conductivity, P-type conductivity, or alternating regions of N-type conductivity and P-type conductivity (e.g., to form a PN junction diode or a multitude of PN junctions within the germanium layer). The doping concentrations can range from 1e17 atoms/cm$^3$ to 1e21 atoms/cm$^3$ with preferable concentrations between 1e19 atoms/cm$^3$ to 1e20 atoms/cm$^3$. The doping profiles within the germanium layer can, for example, be constructed such that the peak concentration is located at the half-height of the germanium layer. Furthermore, the doping profiles within the germanium layer can be optimized to reduce dark current of the photodetector, while providing for high responsivity and high operation speed. In another example, the light-absorbing layer 131 can comprise a germanium-tin layer or any other suitable light-absorbing layer. Such light-absorbing layers can similar be doped so as to have N-type conductivity, P-type conductivity, or alternating regions of N-type conductivity and P-type conductivity. Optionally, this photodetector 130 can further comprise a dielectric cap 136 above the light-absorbing layer 131 and/or a buffer layer 132 stacked between the light-absorbing layer 131 and the first trench isolation region 110 at the top surface 105 of the semiconductor substrate 101. The dielectric cap 136 can comprise, for example, a silicon nitride cap or other suitable dielectric cap. The buffer layer 132 can comprise, for example, a silicon germanium layer (e.g., an epitaxially deposited silicon germanium layer) that facilitates subsequent epitaxial deposition of a germanium light-absorbing layer.

The semiconductor structure 100 can further comprise a dielectric layer 141 covering the photodetector 130 and further extending laterally onto the first trench isolation region 110 beyond the photodetector 130. This dielectric layer 141 can, for example, comprise a silicon nitride layer, a silicon oxynitride layer or any other suitable semiconductor layer. A plurality of second openings 116 can be positioned adjacent to multiple sides of photodetector 130 and, particularly, adjacent to at least the opposing sides 135 and the first end 133 of the photodetector 130. These second openings 116 can extend vertically through dielectric layer 141 and the first trench isolation region 110.

The semiconductor structure 100 can further comprise a second trench isolation region 120 in the semiconductor substrate 101 aligned below the photodetector 130 and the first trench isolation region 110. As discussed in greater detail below with regard to the method of forming this semiconductor structure 100, this second trench isolation region 120 can comprise a second trench 121 that is formed by performing an etch process that expands the lower sections of the second openings 116 within the semiconductor substrate 101 immediately below the first trench isolation region 110 until those lower sections are merged. As a result, the second trench 121 is aligned below the photodetector 130 and the first trench isolation region 110. It should be noted that, due to the etch process used when forming the second trench 121, the sidewalls 126 of the second trench 121 may be angled relative to the bottom surface 125 of the second trench 121 (e.g., as opposed to perpendicular). In any case, this second trench 121 can be filled with one or more second isolation materials 122 (e.g., silicon dioxide, silicon nitride, silicon oxynitride and/or any other suitable isolation material). The second isolation material(s) can be the same as or different from the first isolation material(s) 112. It should be noted that, as a result of the deposition process used to fill the second trench 121 with the second isolation material(s) 122, voids or airgaps (not shown) might be present within the second trench isolation region 120.

The second openings 116 can similarly be filled with the second isolation material(s) 122. Optionally, the first opening 115, which as mentioned above extends vertically through the first trench isolation region 110 and, thus, extends vertically between the photodetector 130 and the second trench isolation region 120, can also be filled with the second isolation material(s) 122. Alternatively, this first opening 115 can be only partially filled with the second isolation material(s) 122. That is, this first opening 115 can have an upper portion, which is immediately adjacent to the photodetector 130 and which is filled with a semiconductor material (i.e., a portion 104 of the semiconductor substrate 101 at the top surface 105) and can also have a lower portion, which is immediately adjacent to the second trench isolation region 120 and which is filled with the second isolation material(s) 122.

Figure 2A:
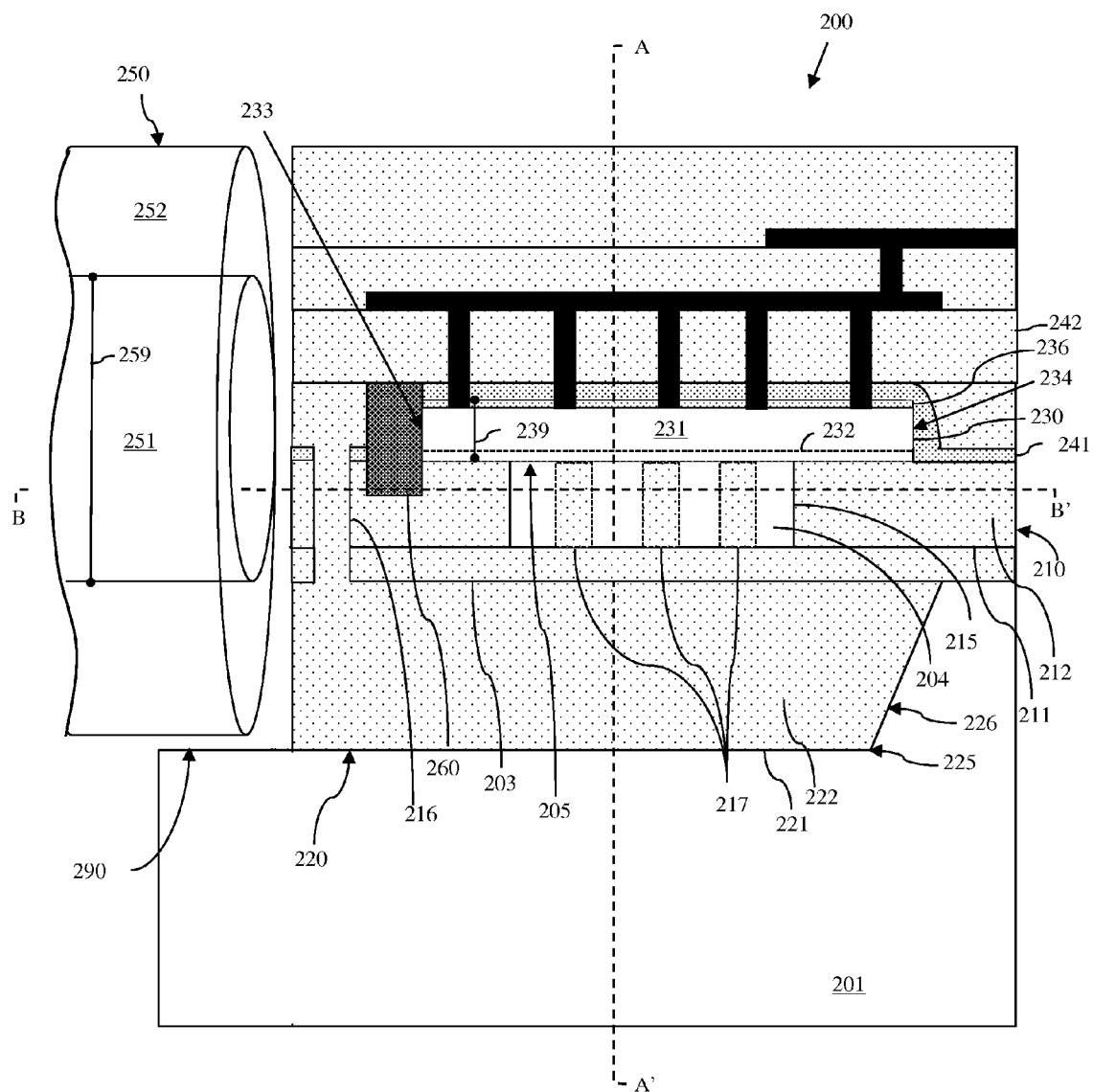
FIG. 2A is a cross-section illustration of a semiconductor structure, which is formed on a bulk semiconductor substrate and which has a photodetector above stacked trench isolation regions.
Figure 2B:
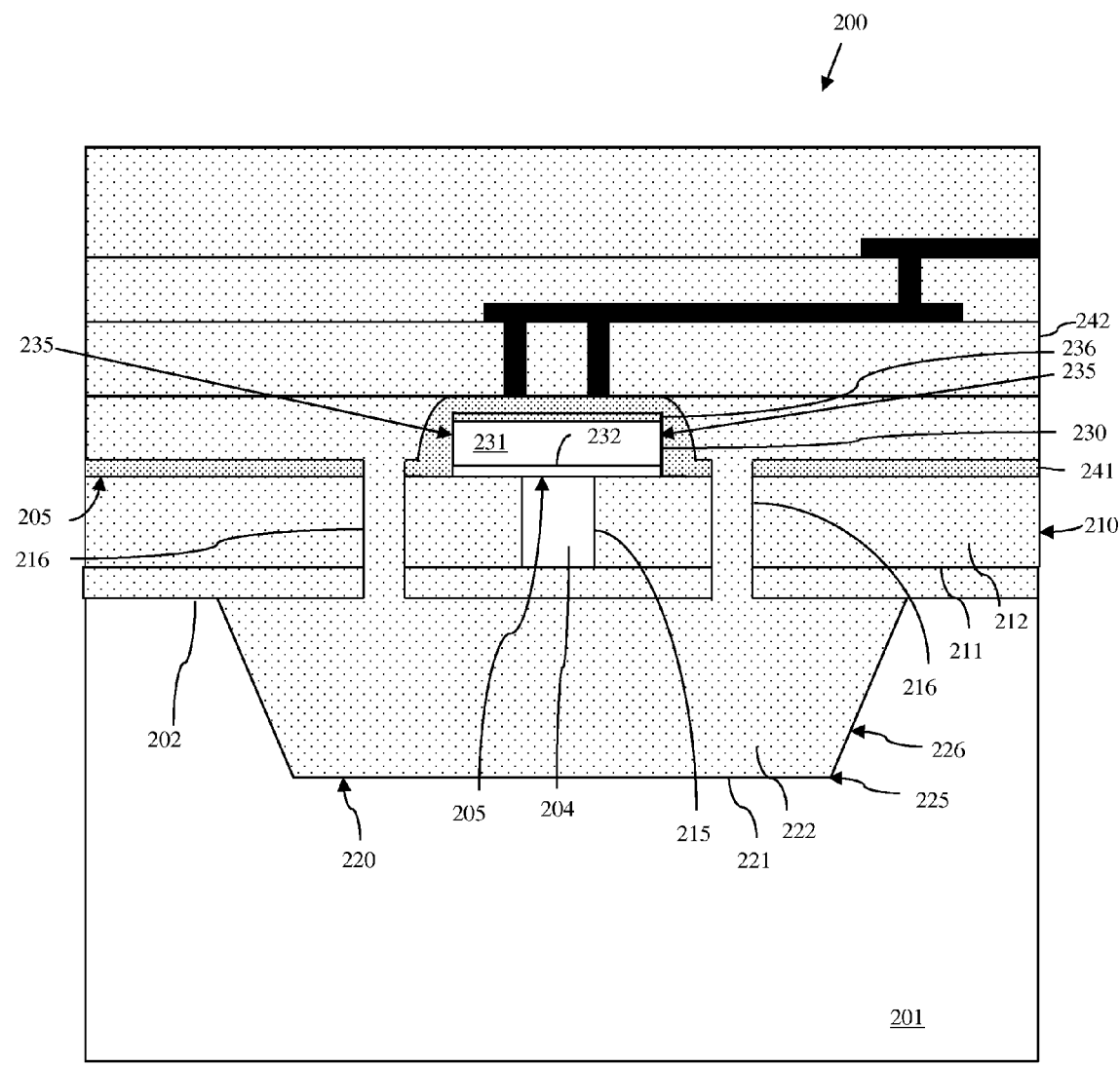
FIG. 2B is another cross-section illustration of the semiconductor structure of FIG. 2A.
Figure 2C:
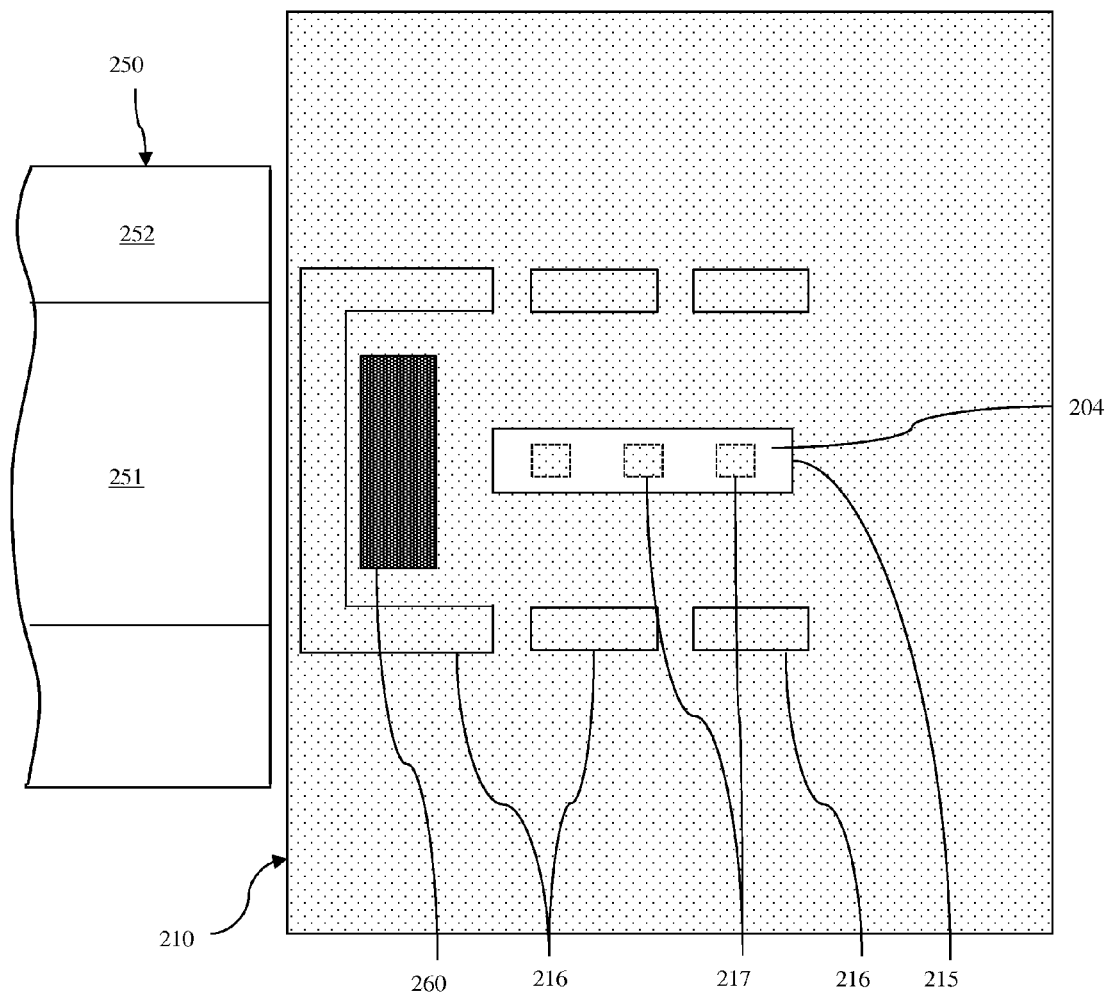
FIG. 2C is yet another cross-section illustration of the semiconductor structure of FIG. 2A.

FIGS. 2A-2C in combination illustrate another semiconductor structure 200. This semiconductor structure 200 is formed on a semiconductor-on-insulator (SOI) wafer and comprises a photodetector 230 on stacked trench isolation regions (i.e., see first trench isolation region 210 above the insulator layer 203 and second trench isolation region 220). FIG. 2A is a cross-section illustration of the semiconductor structure 200 through a vertical plane, which cuts across the length of the structure. FIG. 2B is another cross-section illustration through a different vertical plane A-A', which, as shown in FIG. 2A, cuts across the width of the structure. FIG. 2C is yet another cross-section illustration of the semiconductor structure 200 through a horizontal plane B-B', which, as shown in FIG. 2A, cuts across the semiconductor substrate near the top surface.

Specifically, referring to FIGS. 2A-2C, the semiconductor structure 200 can comprise a semiconductor substrate 201, having a top surface 205 and an insulator layer 203 on the top surface of the semiconductor substrate 201 and a semiconductor layer 204 on the insulator layer 203. The semiconductor substrate 201 can comprise, for example, a silicon substrate or other suitable semiconductor substrate. The insulator layer 203 can comprise, for example, a silicon dioxide layer or other suitable insulator layer. The semiconductor layer 204 can comprise, for example, a silicon layer, a silicon germanium layer or other suitable semiconductor layer 204.

The semiconductor structure 200 can further comprise a first trench isolation region 210 on the insulator layer 203. The first trench isolation region 210 can comprise a first trench 211 and the first trench 211 can be filled with one or more first isolation materials 212 (e.g., silicon dioxide, silicon nitride, silicon oxynitride, and/or any other suitable isolation material). As discussed in greater detail below with regard to the method of forming this semiconductor structure 200, the first trench 211 can be patterned and etched such that the resulting first trench isolation region 210 has a first opening 215 that extends vertically there through and the semiconductor layer 204 can be positioned within the first opening 215 such that the first trench isolation region 210 laterally surrounds and defines the shape of the semiconductor layer 204. This first opening 215 can, for example, be an essentially rectangular-shaped first opening. Optionally, one or more dielectric columns 217 can extend vertically through the semiconductor layer 204 within the first opening 215. As discussed in greater detail below with regard to the method of forming this semiconductor structure 200, the dielectric columns 217 can, for example, be formed during formation of the first trench isolation region 210 such that they comprise the same first isolation material(s) 212.

The semiconductor structure 200 can further comprise a photodetector 230 aligned above the first opening 215. This photodetector 230 can, for example, have the same shape as the first opening 215 (e.g., can have an essentially rectangular shape) and can be slightly larger than the first opening

215 such that it extends laterally onto the first trench isolation region 210. The photodetector 230 can have a first end 233, a second end 234 opposite the first end 233, and opposing sides 235. The photodetector 230 can comprise a light-absorbing layer 231. This light-absorbing layer 231 can absorb light (i.e., optical signals or photons) within predetermined wavelength bands. For example, this light-absorbing layer 231 can comprise a germanium layer (e.g., an epitaxial germanium layer) that absorbs light (i.e., optical signals or photons) in the infrared wavelength bands (i.e., wavelengths (λ) in the range of approximately 1.2μ to 1.7μ). The germanium layer can be doped so as to have N-type conductivity, P-type conductivity, or alternating regions of N-type conductivity and P-type conductivity (e.g., to form a PN junction diode or a multitude of PN junctions within the germanium layer). The doping concentrations can range from 1e17 atoms/cm$^3$ to 1e21 atoms/cm$^3$ with preferable concentrations between 1e19 atoms/cm$^3$ to 1e20 atoms/cm$^3$. The doping profiles within the germanium layer can, for example, be constructed such that the peak concentration is located at the half-height of the germanium layer. Furthermore, the doping profiles within the germanium layer can be optimized to reduce dark current of the photodetector, while providing for high responsivity and high operation speed. In another example, the light-absorbing layer 231 can comprise a germanium-tin layer or any other suitable light-absorbing layer. Such light-absorbing layers can similar be doped so as to have N-type conductivity, P-type conductivity, or alternating regions of N-type conductivity and P-type conductivity. Optionally, this photodetector 230 can further comprise a dielectric cap 236 above the light-absorbing layer 231 and/or a buffer layer 232 stacked between the light-absorbing layer 231 and the semiconductor layer 204. The dielectric cap 236 can comprise, for example, a silicon nitride cap or other suitable dielectric cap. The buffer layer 232 can comprise, for example, a silicon germanium layer (e.g., an epitaxially deposited silicon germanium layer) that facilitates subsequent epitaxial deposition of a germanium light-absorbing layer.

The semiconductor structure 200 can further comprise a dielectric layer 241 covering the photodetector 230 and further extending laterally onto the first trench isolation region 110 beyond the photodetector 230. This dielectric layer 241 can, for example, comprise a silicon nitride layer, a silicon oxynitride layer or any other suitable semiconductor layer. A plurality of second openings 216 can be positioned adjacent to multiple sides of the photodetector 230 and, particularly, adjacent to at least the opposing sides 235 and the first end 233 of the photodetector 230. These second openings 216 can extend vertically through dielectric layer 241, the first trench isolation region 210 and the insulator layer 203.

The semiconductor structure 200 can further comprise a second trench isolation region 220 in the semiconductor substrate 201 below and immediately adjacent to the insulator layer 203 and, particularly, aligned below the photodetector 230 and the first trench isolation region 210. As discussed in greater detail below with regard to the method of forming this semiconductor structure 200, this second trench isolation region 220 can comprise a second trench 221 that is formed by performing an etch process that expands the lower sections of the second openings 216 within the semiconductor substrate 201 immediately below the insulator layer 203 until those lower sections are merged. As a result, the second trench 221 is aligned below the photodetector 230 and the first trench isolation region 210. It should be noted that, due to the etch process used when forming the second trench 221, the sidewalls 226 of the second trench 221 may be angled relative to the bottom surface 225 of the second trench 221 (e.g., as opposed to perpendicular). In any case, this second trench 221 can be filled with one or more second isolation materials 222 (e.g., silicon dioxide, silicon nitride, silicon oxynitride and/or any other suitable isolation material). The second isolation material(s) 222 can be the same as or different from the first isolation material(s). It should be noted that, as a result of the deposition process used to fill the second trench 221 with the second isolation material(s) 222, voids or airgaps (not shown) might be present within the second trench isolation region 220. The second openings 216 can similarly be filled with the second isolation material(s) 222.

Each of the above-described semiconductor structures 100 of FIGS. 1A-1C and 200 of FIGS. 2A-2C can further comprise an antireflective (AR) spacer 160, 260 positioned laterally adjacent to the first end 133, 233 and, particularly, positioned laterally adjacent to the light signal-receiving end of the photodetector 130, 230. This antireflective (AR) spacer 160, 260 can comprise, for example, titanium nitride or any other suitable antireflective material. This antireflective (AR) spacer 160, 260 can further have a quarter-wave thickness or multiple thereof. That is, the thickness of the antireflective (AR) spacer can be ¼ the wavelength of the optical signals, which are intended to be transmitted to and captured by the photodetector 130, 230.

Each of the above-described semiconductor structures 100 of FIGS. 1A-1C and 200 of FIGS. 2A-2C can further comprise one or more additional dielectric layers 142, 242 (e.g., interlayer dielectrics) above the dielectric layer 141, 241. The additional dielectric layer(s) 142, 242 can comprise, for example, one or more layers of any of the following dielectric materials: silicon dioxide, silicon nitride, silicon oxynitride, borophosphosilicate glass (BPSG), etc. One or more contacts and other interconnects (e.g., wires and vias) within the additional dielectric layer(s) 142, 242 can electrically connect the photodetector 130, 230 to one or more other on-chip devices.

Additionally, in each of the above-described semiconductor structures 100 of FIGS. 1A-1C and 200 of FIGS. 2A-2C, the photodetector 130, 230 can be optically coupled to an off-chip optical fiber 150, 250. That is, an exposed edge 190, 290 of the semiconductor substrate 101, 201 can extend laterally beyond the first end 133, 233 of the photodetector 130, 230, beyond the antireflective (AR) spacer 160, 260, beyond the stacked trench isolation regions and, if applicable, beyond the insulator layer. This exposed edge 190, 290 can have a groove (e.g., a V-groove) for receiving an off-chip optical fiber 150, 250. An end of the off-chip optical fiber 150, 250 can be positioned in the groove on this edge 190, 290 adjacent to the antireflective (AR) spacer 160, 260 such that the optical fiber 150, 250 is in end-to-end alignment with the first end 133, 233 of the photodetector 130, 230 and, thereby such that it is optically coupled to the photodetector 130, 230. The optical fiber 150, 250 can comprise a core 151, 251 and cladding 152, 252 around this core 151, 251. Both the core 151, 251 and the cladding 152, 252 can comprise light-transmissive materials; however, the core material(s) can have a refractive index that is higher than that of the cladding material(s) so that light signals can be confined to and propagated along the core. Such an optical fiber 150, 250 can transmit optical signals to the photodetector 130, 230 so that the photodetector 130, 230 can convert the optical signals into electrical signals that can be transmitted to one or more other on-chip devices through the contacts and interconnects described above.

Figure 3:
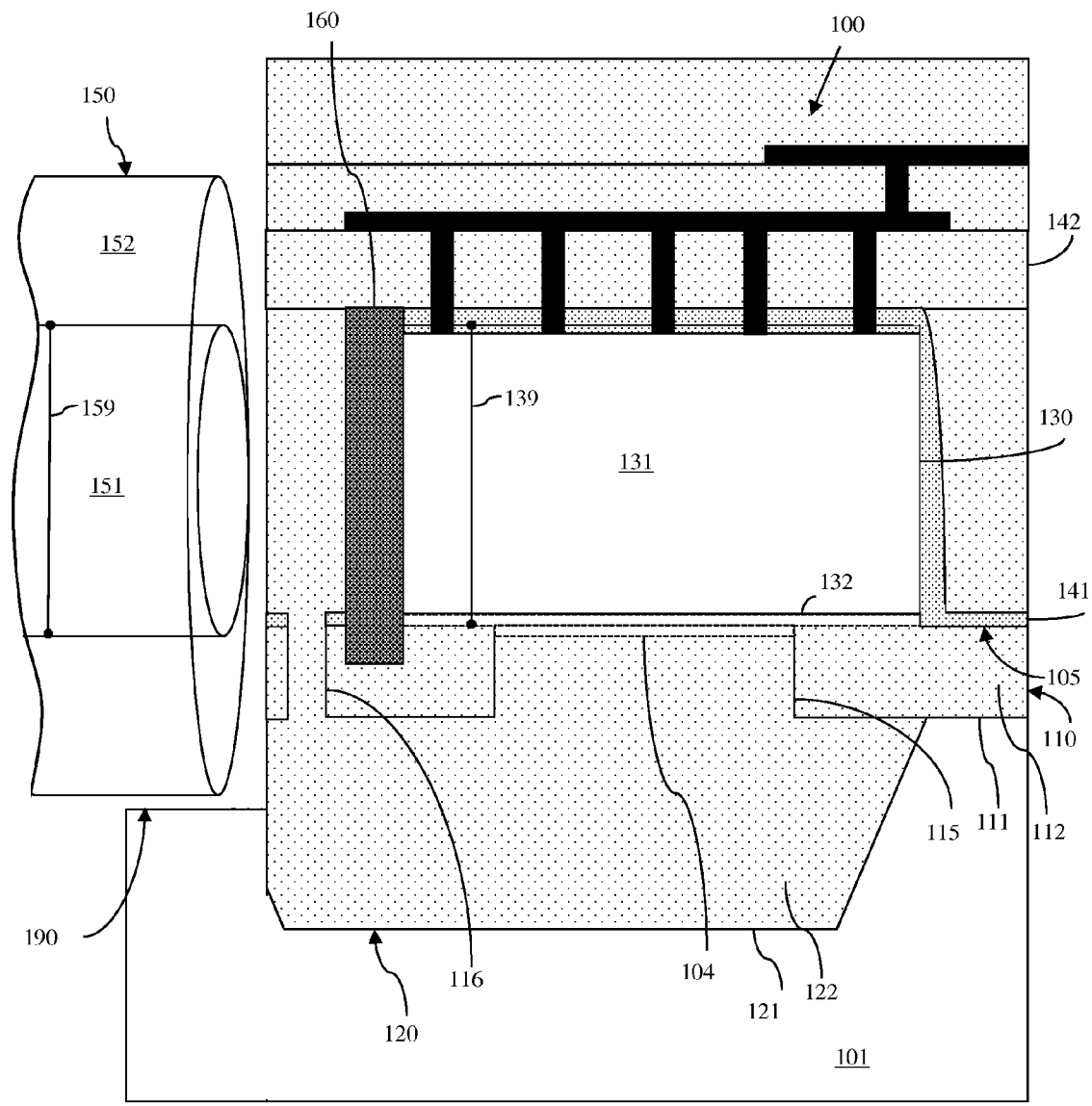
FIG. 3 is a cross-section illustration of an alternative embodiment of the semiconductor structure of FIGS. 1A-1C.
Figure 4:
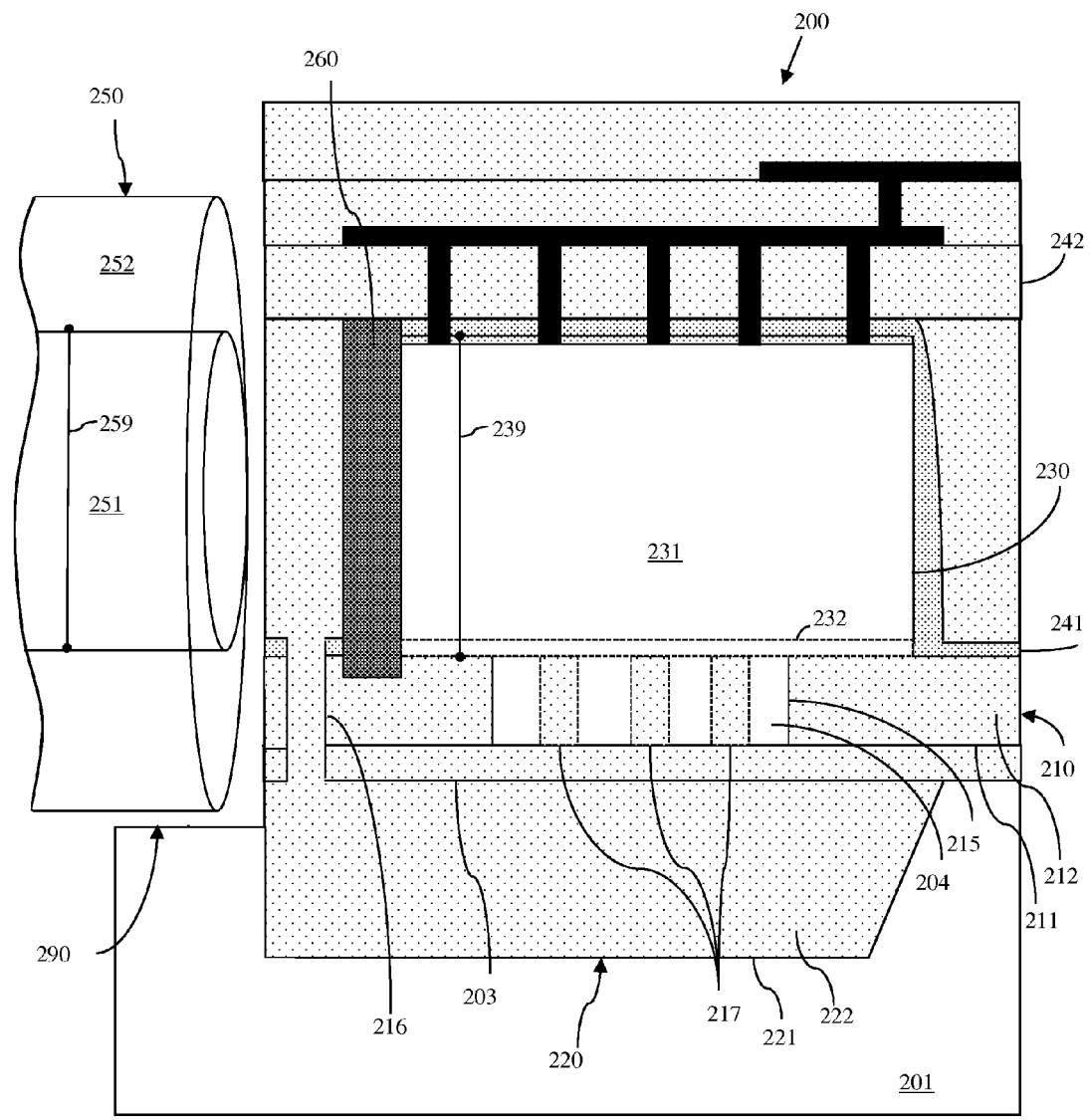
FIG. 4 is a cross-section illustration of an alternative embodiment of the semiconductor structure of FIG. 2A-2C.

As illustrated in FIGS. 1A and 2A, in each of the semiconductor structures 100, 200 disclosed herein, the photodetector 130, 230 can have a height 139, 239 that is less than the diameter 159, 259 of the core 151, 251 of the optical fiber 150, 250. However, alternatively, as illustrated in FIGS. 3 and 4, in each of the semiconductor structures 100, 200, the photodetector 130, 230 can have a height 139, 239 that is approximately equal to the diameter 159, 259 of the core 151, 251 of the optical fiber 150, 250 for better optical coupling. In any case, during transmission of the optical signals from the optical fiber 150, 250 to the photodetector 130, 230, the isolation material that is below the photodetector 130, 230 (i.e., the stacked trench isolation regions, including the first trench isolation region 110, 210 and the second trench isolation region 120, 220, as well as the insulator layer 203, if applicable) can prevent optical signal loss into the semiconductor substrate 101, 201 below. Furthermore, in the semiconductor structure 200 of FIGS. 2A-2C the optional dielectric columns 217 can be used to minimize optical signal loss into the semiconductor layer 204.

Figure 5:
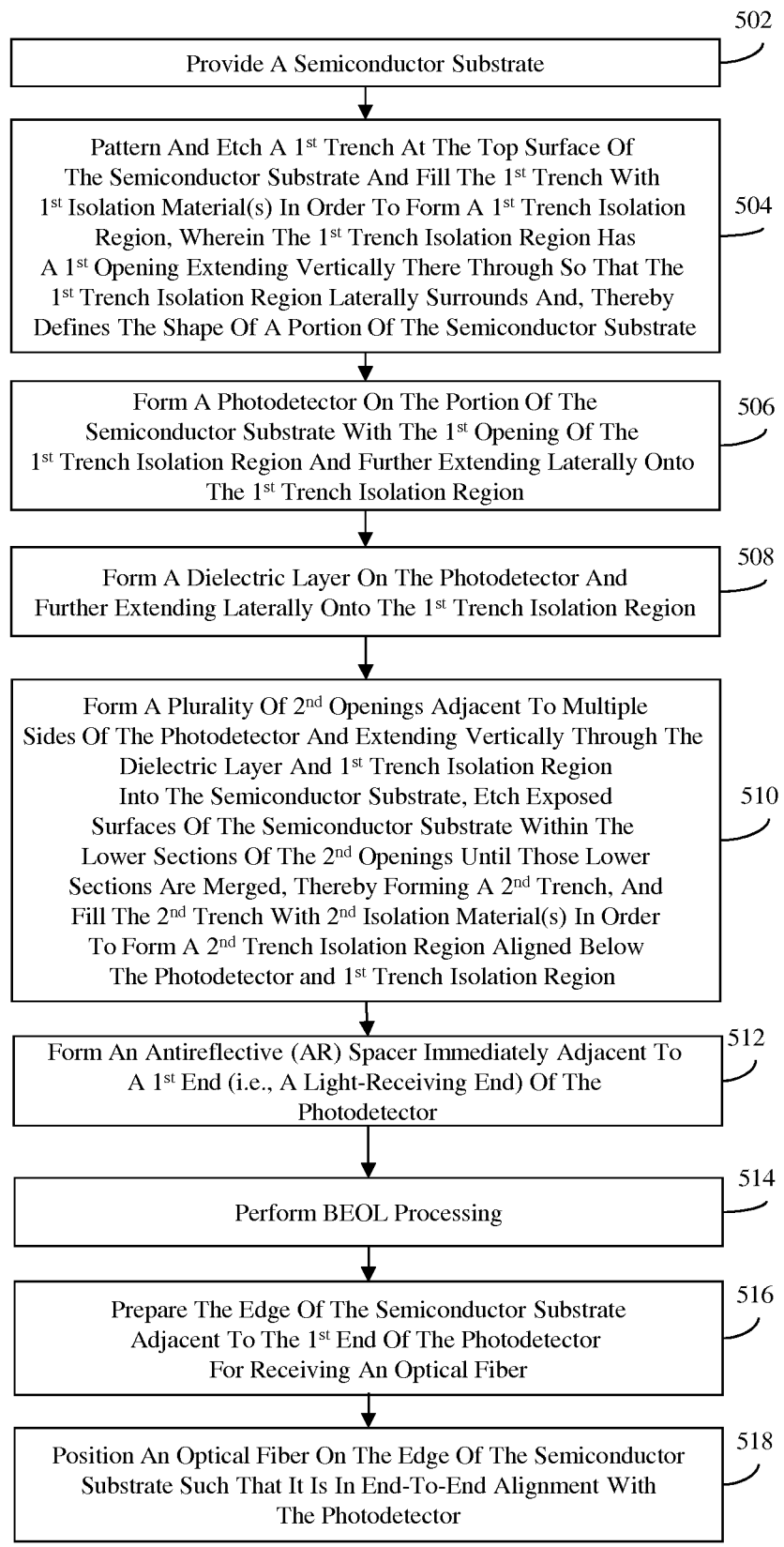
FIG. 5 is a flow diagram illustrating a method of forming the semiconductor structure of FIGS. 1A-1C (or FIG. 3)

Referring to the flow diagram of FIG. 5, also disclosed herein is a method of forming, on a bulk semiconductor wafer, the semiconductor structure 100, as described in detail above, comprising a photodetector 130 on stacked trench isolation regions (i.e., the first trench isolation region 110 and the second trench isolation region 120).

Specifically, the method can comprise providing a bulk semiconductor wafer comprising a semiconductor substrate 101 having a top surface 105 (502). This semiconductor substrate 101 can comprise, for example, a silicon substrate or other suitable semiconductor substrate.

Figure 6:
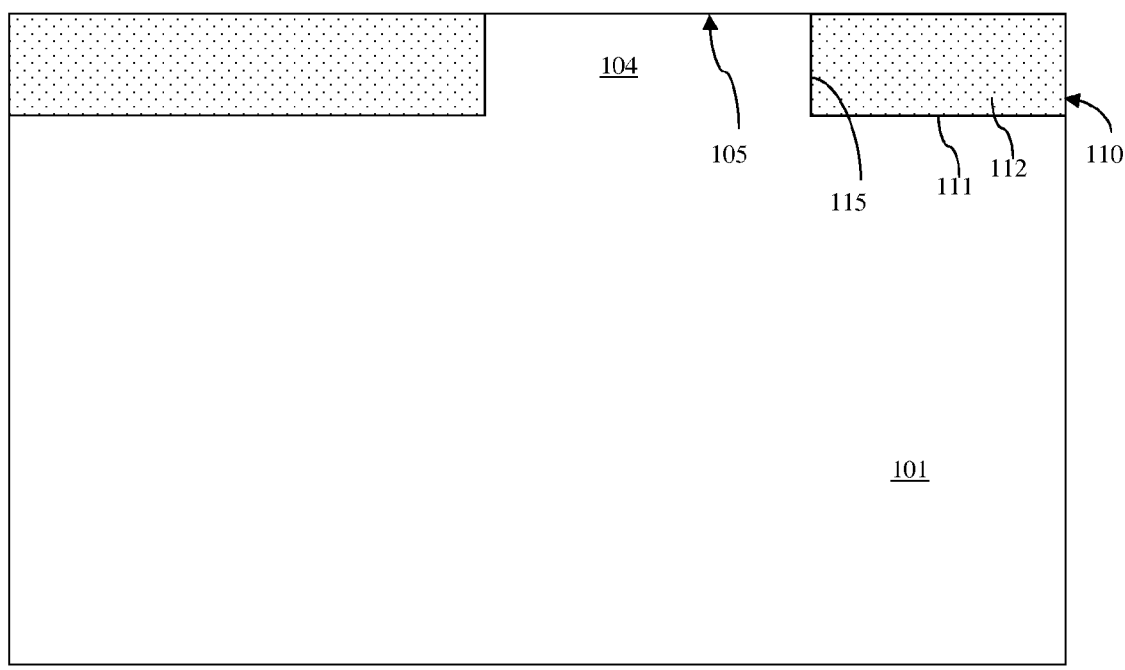
FIG. 6 is a cross-section illustration of a partially completed semiconductor structure formed according to the method of FIG. 5.

The method can further comprise forming a first trench isolation region 110 in the semiconductor substrate 101 at the top surface 105 (504, see FIG. 6). To form the first trench isolation region 110, a first trench 111 can be formed (e.g., lithographically patterned and etched) at the top surface of the semiconductor substrate 101. This first trench 111 can subsequently be filled with one or more first isolation materials 112 (e.g., silicon dioxide, silicon nitride, silicon oxynitride, and/or any other suitable isolation material). It should be noted that the first trench 111 can be patterned and etched such that the resulting first trench isolation region 110 has a first opening 115 extending vertically there through and such that a portion 104 of the semiconductor substrate 101 is within the first opening 115 laterally surrounded by the first trench isolation region 110. Thus, the shape of the first opening 115 of the first trench isolation region 110 defines the shape of this portion 104 of the semiconductor substrate 101. This first opening 115 can, for example, be an essentially rectangular-shaped first opening.

Figure 7:
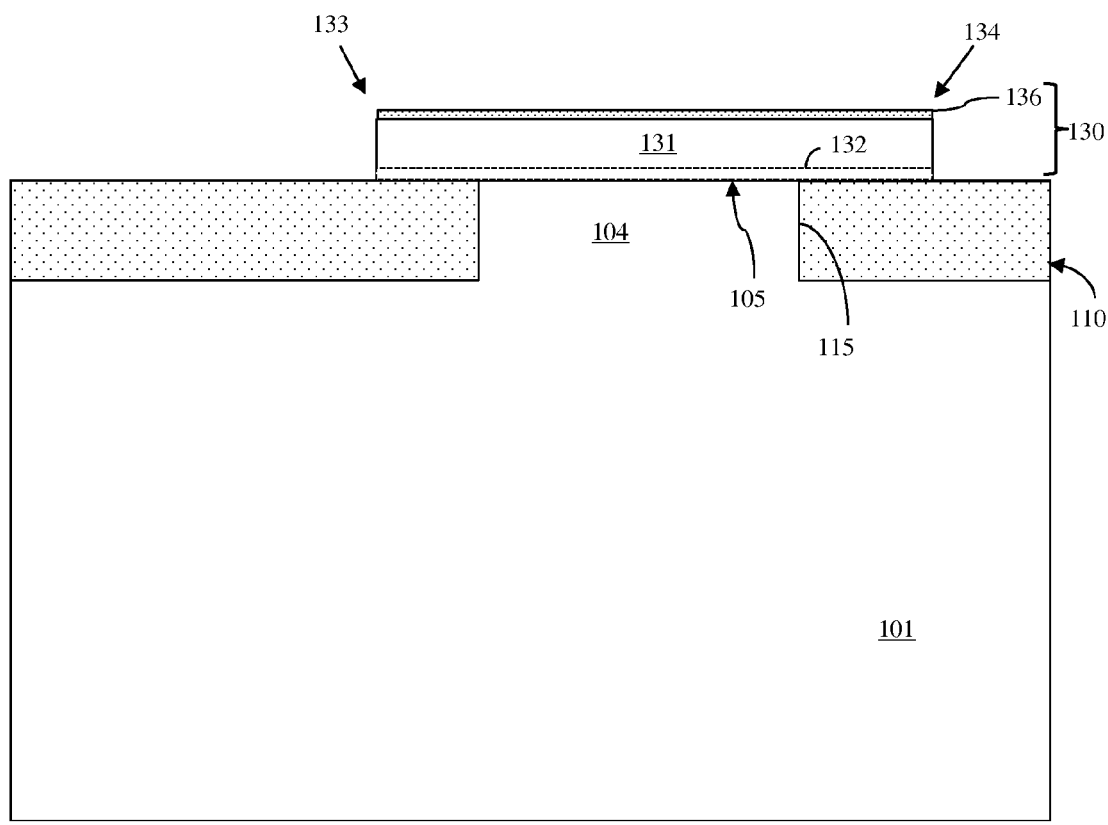
FIG. 7 is a cross-section illustration of a partially completed semiconductor structure formed according to the method of FIG. 5.

This method can further comprise forming a photodetector 130 on the top surface 105 aligned above the first opening 115 (506, see FIG. 7). Specifically, a light-absorbing layer 131 can be formed (e.g., epitaxially deposited) on the top surface 105 of the semiconductor substrate 101 (e.g., at the portion 104 defined by the first trench isolation region 110) such that it extends laterally over the first trench isolation region 110. This light-absorbing layer 131 can comprise a light absorbing material and, particularly, a material that absorbs light (i.e., optical signals or photons) within predetermined wavelength bands. For example, this light-absorbing layer 131 can comprise a germanium layer (e.g., an epitaxial germanium layer) that absorbs light (i.e., optical signals or photons) in the infrared wavelength bands (i.e., wavelengths ($\lambda$) in the range of approximately 1.2µ to 1.7µ). The germanium layer can be in-situ doped during epitaxial deposition (or subsequently doped) so as to have N-type conductivity, P-type conductivity, or alternating regions of N-type conductivity and P-type conductivity (e.g., to form a PN junction diode or a multitude of PN junctions within the germanium layer). The doping concentrations can range from $1e17$ atoms/cm$^3$ to $1e21$ atoms/cm$^3$ with preferable concentrations between $1e19$ atoms/cm$^3$ to $1e20$ atoms/cm$^3$. The doping profiles within the germanium layer can, for example, be constructed such that the peak concentration is located at the half-height of the germanium layer. Furthermore, the doping profiles within the germanium layer can be optimized to reduce dark current of the photodetector, while providing for high responsivity and high operation speed. In another example, the light-absorbing layer 131 can comprise a germanium-tin layer or any other suitable light-absorbing layer. Such light-absorbing layers can similar be doped so as to have N-type conductivity, P-type conductivity, or alternating regions of N-type conductivity and P-type conductivity. Optionally, prior to formation of the light-absorbing layer 131, a buffer layer 132 can be formed (e.g., epitaxially deposited) and, following formation of the light-absorbing layer 131, a dielectric cap layer 136 can be formed (e.g., deposited). The buffer layer 132 can comprise, for example, a silicon germanium layer (e.g., an epitaxially deposited silicon germanium layer) that facilitates subsequent epitaxial deposition of a germanium light-absorbing layer. The dielectric cap layer 136 can comprise, for example, a silicon nitride cap layer or other suitable dielectric cap layer. Those skilled in the art will recognize that if the above-described optional buffer layer 132 and light-absorbing layer 131 are formed by epitaxial deposition, such processes are typically followed by an anneal. In any case, the light-absorbing layer 131 and, if applicable, the buffer layer 132 and dielectric cap layer 136 can subsequently be lithographically patterned and etched to form the photodetector 130 such that the photodetector 130 is aligned above the first opening 115 and is slightly larger than the first opening 115 so as to extend laterally onto the first trench isolation region 110. The resulting photodetector 130 can, for example, have essentially the same shape as the first opening 115 (e.g., an essentially rectangular shape) with a first end 133, a second end 134 opposite the first end 133, and opposing sides.

It should be noted that the photodetector 130 can specifically be formed at process 506 so that its height 139 will be less than the diameter 159 of a core 151 of an optical fiber 150 to which it will be coupled in the resulting semiconductor structure 100 (see FIG. 1A). Alternatively, the photodetector 130 can specifically be formed at process 506 so that its height 139 will be approximately equal to the diameter 159 of a core 151 of an optical fiber 150 to which it will be coupled in the resulting semiconductor structure 100 (see FIG. 3).

Figure 8:
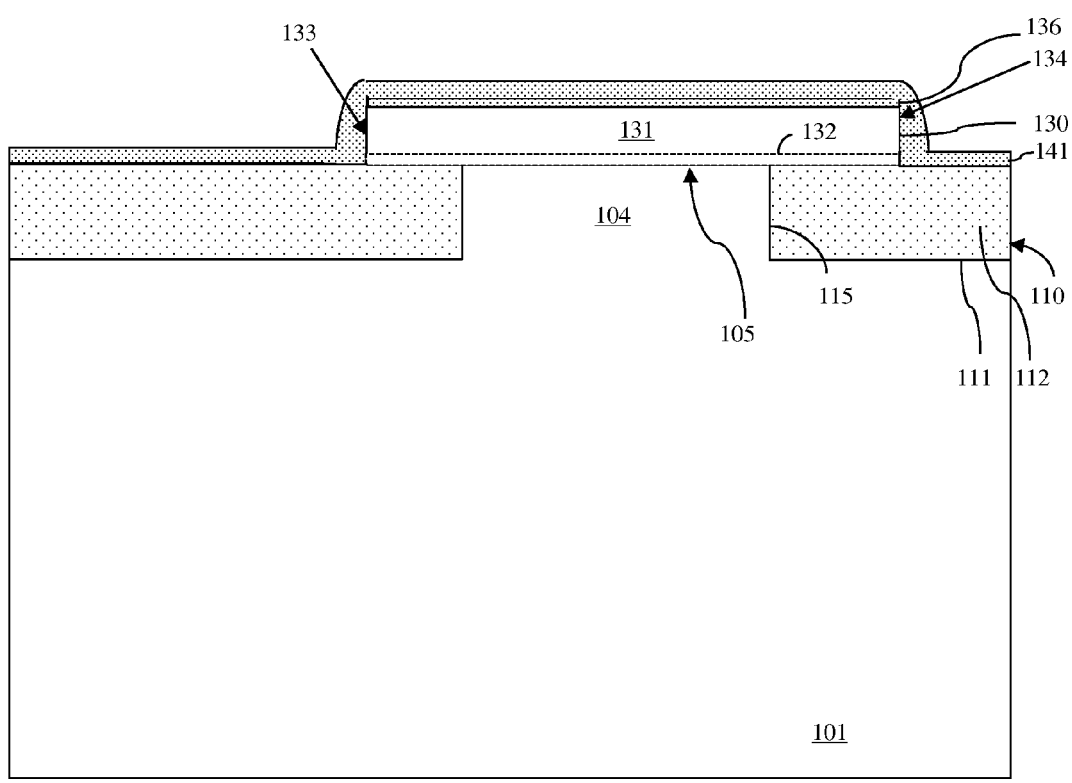
FIG. 8 is a cross-section illustration of a partially completed semiconductor structure formed according to the method of FIG. 5.

In any case, after forming the photodetector 130, a dielectric layer 141 can be formed (e.g., conformally deposited) such that it covers the photodetector 130 and further extends laterally onto the first trench isolation region 110 (508, see FIG. 8). This dielectric layer 141 can comprise, for example, a silicon nitride layer, a silicon oxynitride layer or any other suitable semiconductor layer.

Figure 9A:
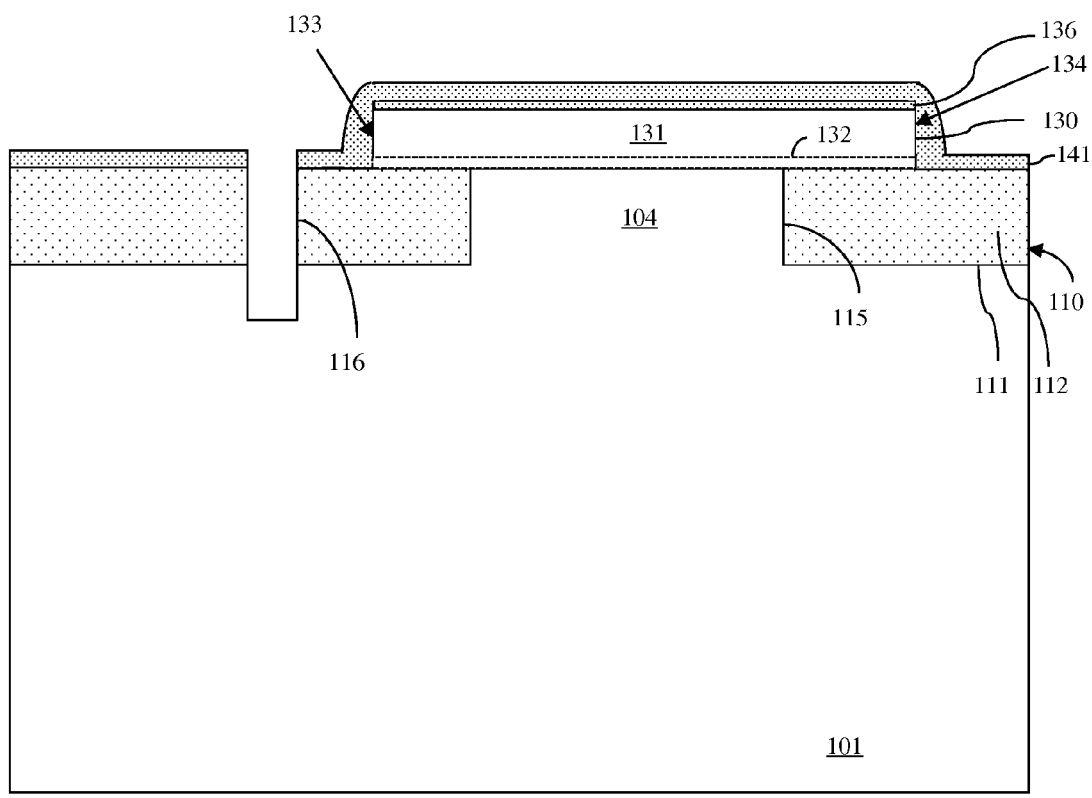
FIG. 9A is a cross-section illustration of a partially completed semiconductor structure formed according to the method of FIG. 5.
Figure 9B:
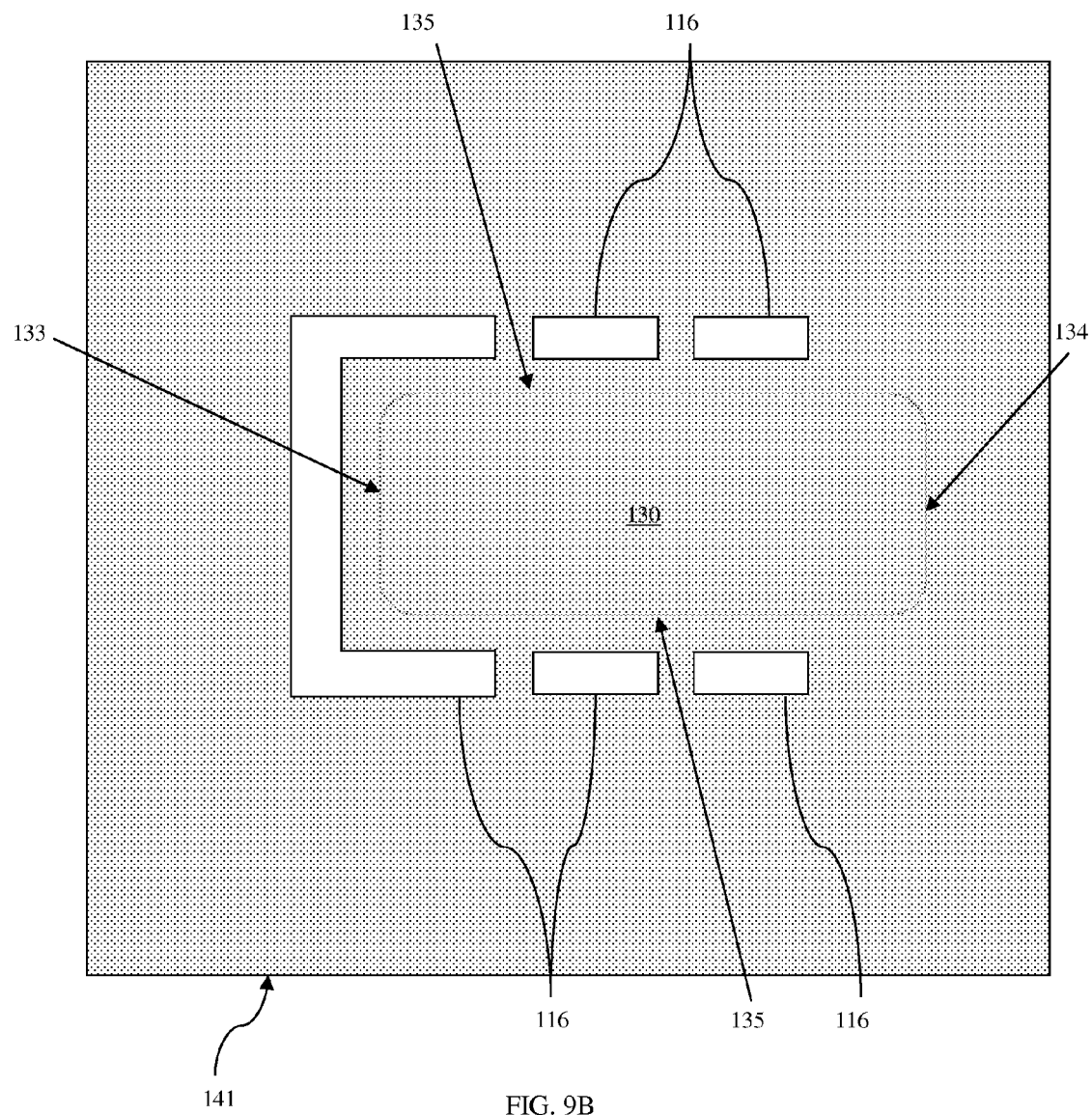
FIG. 9B is a top view diagram illustrating the partially completed semiconductor structure of FIG. 9A.

Then, a second trench isolation region 120 can be formed in the semiconductor substrate 101 aligned below the photodetector 130 and the first trench isolation region 110 (510). Specifically, a plurality of second openings 116 can be formed (e.g., lithographically patterned and etched) such that they extend vertically through the dielectric layer 141 and the first trench isolation region 110 into the semiconductor substrate 101 and further such that they are positioned adjacent to multiple sides of the photodetector 130 and, particularly, adjacent to at least the first end 133 (i.e., the light-receiving end) and the opposing sides 135 of the photodetector 130 (see FIGS. 9A-9B). Once the second openings 116 are formed, exposed surfaces of the semiconductor substrate 101 in the lower sections of the second openings 116 can be etched until those lower sections are merged in order to form a second trench 121 in the semiconductor substrate 101 and this second trench 121 and the second openings 116 can then be filled with one or more second isolation material(s) 122 so as to form the second trench isolation region 120 aligned below the photodetector 130 and the first trench isolation region 110 (see FIG. 10). The second isolation material(s) 122 can comprise, for example, silicon dioxide, silicon nitride, silicon oxynitride and/or any other suitable isolation material. The second isolation material(s) 122 can be the same as or different from the first isolation material(s) 112.

The specifications for the above-described etch process used to form the second trench 121 should specifically be chosen so that the semiconductor material of the semiconductor substrate 101 will be selectively etched over the materials used for the dielectric layer 141 and first trench isolation region 110. For example, if the semiconductor substrate 101 comprises silicon, if the first isolation material 112 of the first trench isolation region 110 comprises silicon dioxide, and if the dielectric layer 141 comprises silicon nitride, the etch process used to form the second trench 121 can comprise a wet chemical etch process, which uses an etchant, such as tetramethylammonium hydroxide (TMAH), ammonium hydroxide ($NH_4OH$), ethylenediamine pyrocatechol (EDP), potassium hydroxide (KOH), or any other suitable etchant capable of etching silicon over the various dielectric and insulator materials. Those skilled in the art will recognize that alternative etchants could be used depending upon the chemical differences between the semiconductor substrate 101, the dielectric layer 141 and the first isolation material(s) of the first trench isolation region 110. Those skilled in the art will recognize that such wet chemical etch processes typically also exhibit etch selectivity along crystal planes (e.g., selectivity for silicon that is significantly higher in the [100] direction than in the [111] direction). As a result, the bottom surface 125 of the second trench 121 may remain essentially parallel to the top surface 105 of the semiconductor substrate 101, but the sidewalls 126 may be angled, as opposed to perpendicular, relative to the top surface 105 of the semiconductor substrate 101.

Figure 10:
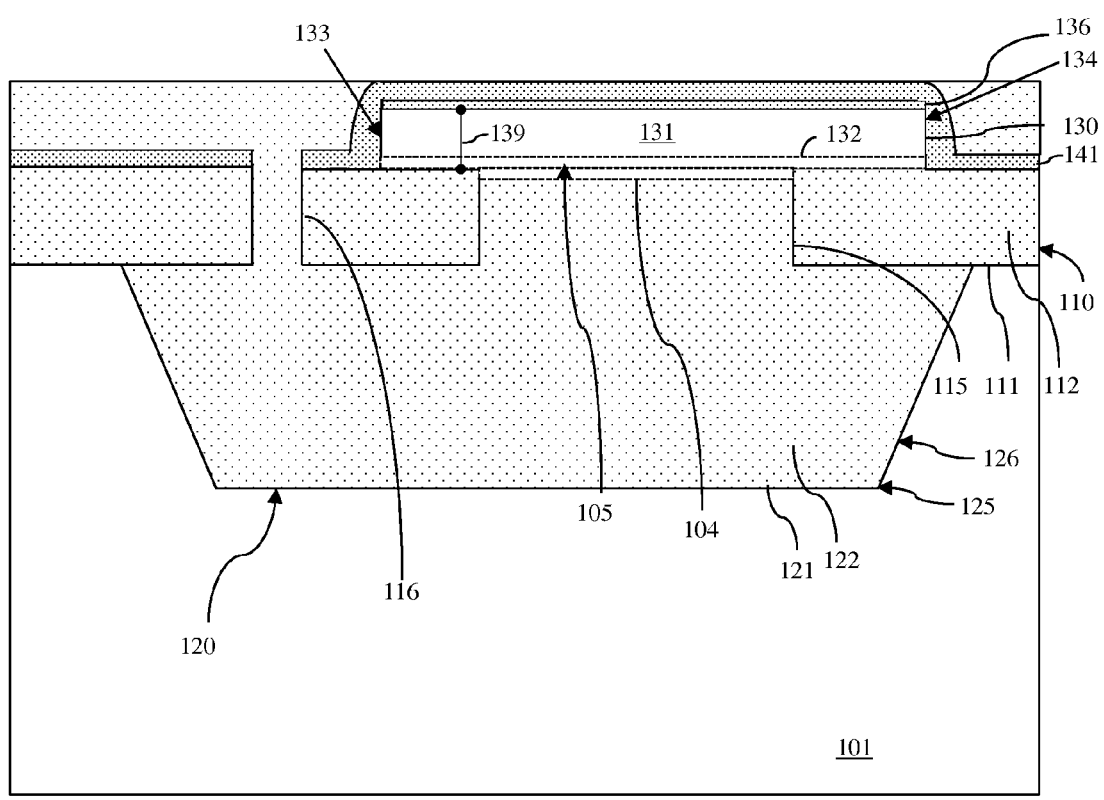
FIG. 10 is a cross-section illustration of a partially completed semiconductor structure formed according to the method of FIG. 5.

Additionally, it should be noted that remaining sections of the dielectric layer 141 and first trench isolation region 110 (e.g., between the second openings 116) as well as the adjacent substrate material provide adequate support for the photodetector 130 during etching of the second trench 121 and prior to filling the second trench 121 with the second isolation material(s) 122. Furthermore, it should be noted that, during the above-described etch process used to form the second trench 121, the portion 104 of the semiconductor substrate 101 within the first opening 115 in the first trench isolation region 110 will eventually be exposed to the etchant used and, thereby etched from below so that it is either entirely removed or at least partially removed. Thus, the process of filling the second trench 121 with the second isolation material(s) 122 can also result in the first opening 115 being completely filled with the second isolation material(s) 122 or partially filled with the second isolation material(s) (as illustrated in FIG. 10). That is, if all of the semiconductor material of the portion 104 of the semiconductor substrate 101 within the first opening 115 is etched out during formation of the second trench 121, then the first opening 115 may subsequently be completely filled with the second isolation material(s) 122. Alternatively, if only the semiconductor material within the lower portion of the first opening 115 is etched out, then only the lower portion of the first opening 115 will be filled with the second isolation material(s) 122 and the upper portion will remain filled with semiconductor material.

Figure 11:
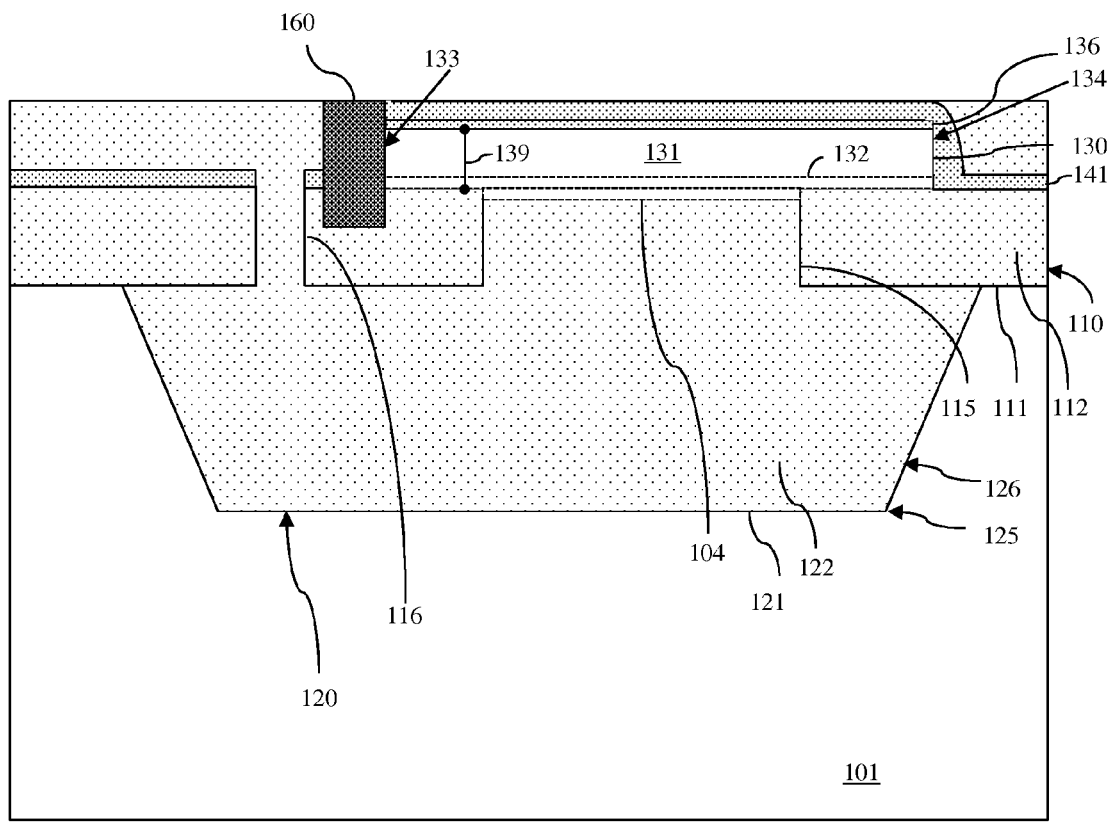
FIG. 11 is a cross-section illustration of a partially completed semiconductor structure formed according to the method of FIG. 5.

Next, an antireflective (AR) spacer 160 can be formed such that it is positioned laterally immediately adjacent to the first end 133 and, particularly, immediately adjacent to the light signal-receiving end of the photodetector 130 (512, see FIG. 11). For example, a trench can be lithographically patterned and etched through the dielectric layer 141 and into the first trench isolation region 110 immediately adjacent to the first end 133 of the photodetector 130. This trench can subsequently be filled with an antireflective (AR) material in order to form the antireflective (AR) spacer 160. The antireflective (AR) material can comprise, for example, titanium nitride or any other suitable antireflective material. This antireflective (AR) spacer 160 should be formed at process 512 so as to have a quarter-wave thickness or multiple thereof. That is, the thickness of the antireflective (AR) spacer can be ¼ the wavelength of the optical signals, which are intended to be transmitted to and captured by the photodetector 130.

Following formation of the antireflective (AR) spacer 160, back end of the line (BEOL) processing can be performed in order to form contacts and other interconnects (e.g., wires and vias) in one or more additional dielectric layers 142 (i.e., interlayer dielectrics such as, silicon dioxide, silicon nitride, silicon oxynitride, borophosphosilicate glass (BPSG), etc.) above the dielectric layer 141 in order to electrically connect the photodetector 130 to one or more other on-chip devices (514, see FIGS. 1A-1C). Additionally, an edge 190 of the semiconductor substrate 101 adjacent to the first end 133 of the photodetector 130 can be prepared for receiving an off-chip optical fiber 150 so that optical fiber 150 can be coupled to the photodetector 130 (516, see FIGS. 1A-1C). As mentioned above with regard to the semiconductor structure 100, an optical fiber 150 can comprise a core 151 and cladding 152 around this core 151. Both the core 151 and the cladding 152 can comprise light-transmissive materials; however, the core material(s) can have a refractive index that is higher than that of the cladding material(s) so that light signals can be confined to and propagated along the core. To prepare the edge 190 of the semiconductor substrate 101 for receiving an optical fiber 150, this edge 190 can be exposed (e.g., using a masked etch process) such that it extends laterally beyond that first end 133 of the photodetector 130, the antireflective (AR) spacer 160, the first trench isolation region 110 and the second trench isolation region 120. Then, a groove (e.g., a V-groove) for receiving the optical fiber 150 can be formed (e.g., lithographically patterned and etched) on the exposed edge 190 such that it is aligned the photodetector 130.

After the edge 190 of the semiconductor substrate 101 is prepared for receiving an optical fiber, as described above, one end of the optical fiber 150 can be positioned within the groove and adjacent to the antireflective (AR) spacer 160 such that it is in end-to-end alignment with the first end 133 of the photodetector 130 and, thereby such that it is optically coupled to the photodetector 130 (518, see FIGS. 1A-1C). Once the optical fiber 150 is coupled to the photodetector 130 in this manner, the optical fiber 150 can transmit optical signals to the photodetector 130 and the photodetector 130 can convert those optical signals into electrical signals, which can, in turn, be transmitted to one or more other on-chip devices through the contacts and interconnects described above. During transmission of the optical signals from the optical fiber 150 to the photodetector 130, the isolation material that is below the photodetector 130 (e.g., in the stacked trench isolation regions, including the first trench isolation region 110 and the second trench isolation region 120) can prevent optical signal loss into the semiconductor substrate 101.

Figure 12:
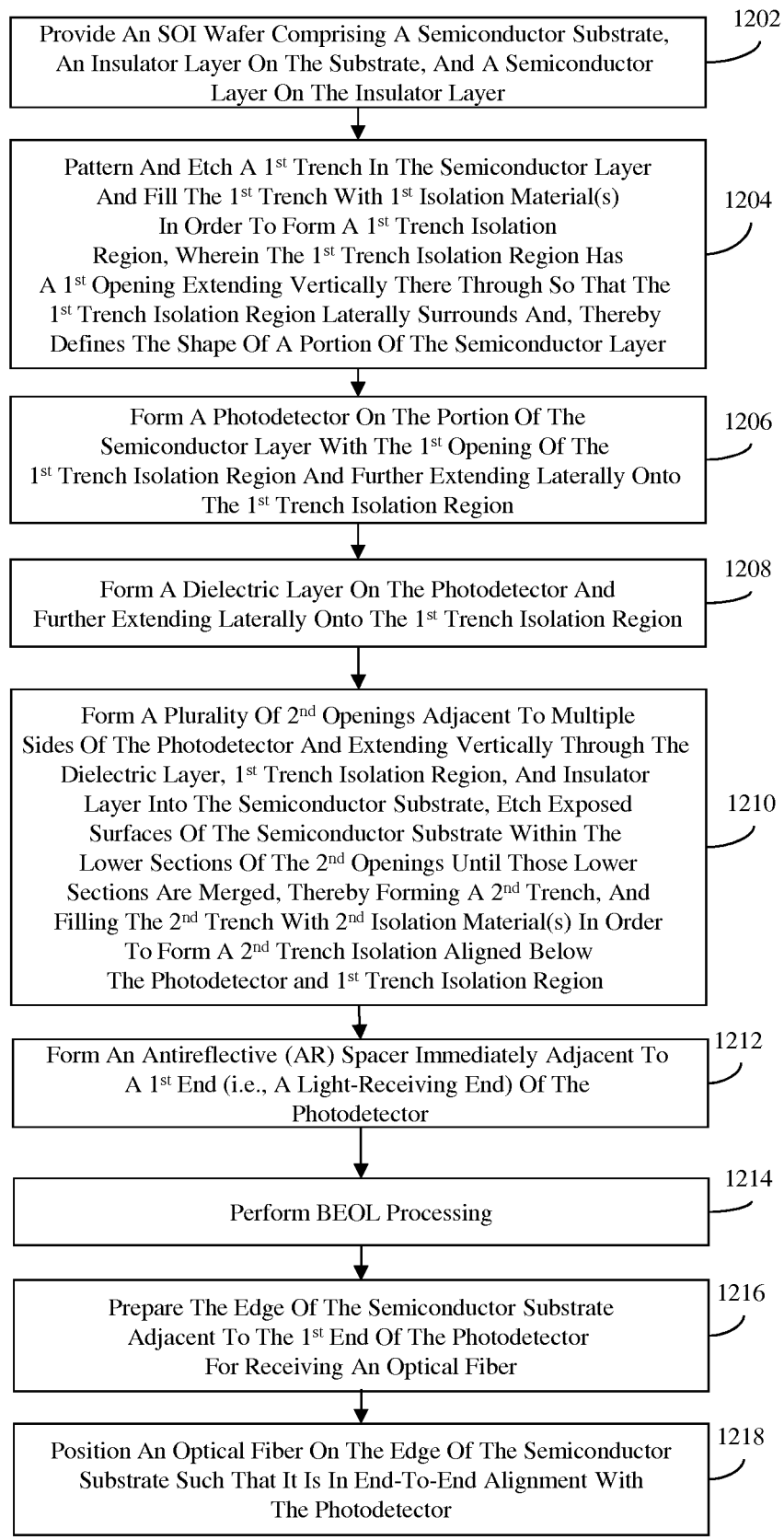
FIG. 12 is a flow diagram illustrating a method of forming the semiconductor structure of FIGS. 2A-2C (or FIG. 4)

Referring to the flow diagram of FIG. 12, also disclosed herein is a method of forming, on a semiconductor-on-insulator (SOI) wafer, the semiconductor structure 200, as described in detail above, comprising a photodetector 230 on stacked trench isolation regions (i.e., the first trench isolation region 210 and the second trench isolation region 220).

Specifically, the method can comprise providing a semiconductor-on-insulator (SOI) wafer comprising a semiconductor substrate 201 having a top surface 205, an insulator layer 203 on the top surface 205 of the semiconductor substrate 201 and a semiconductor layer on the insulator layer 203 (1202). The semiconductor substrate 201 can comprise, for example, a silicon substrate or other suitable semiconductor substrate. The insulator layer 203 can comprise, for example, a silicon dioxide layer or other suitable insulator layer. The semiconductor layer can comprise, for example, a silicon layer, a silicon germanium layer or other suitable semiconductor layer.

Figure 13:
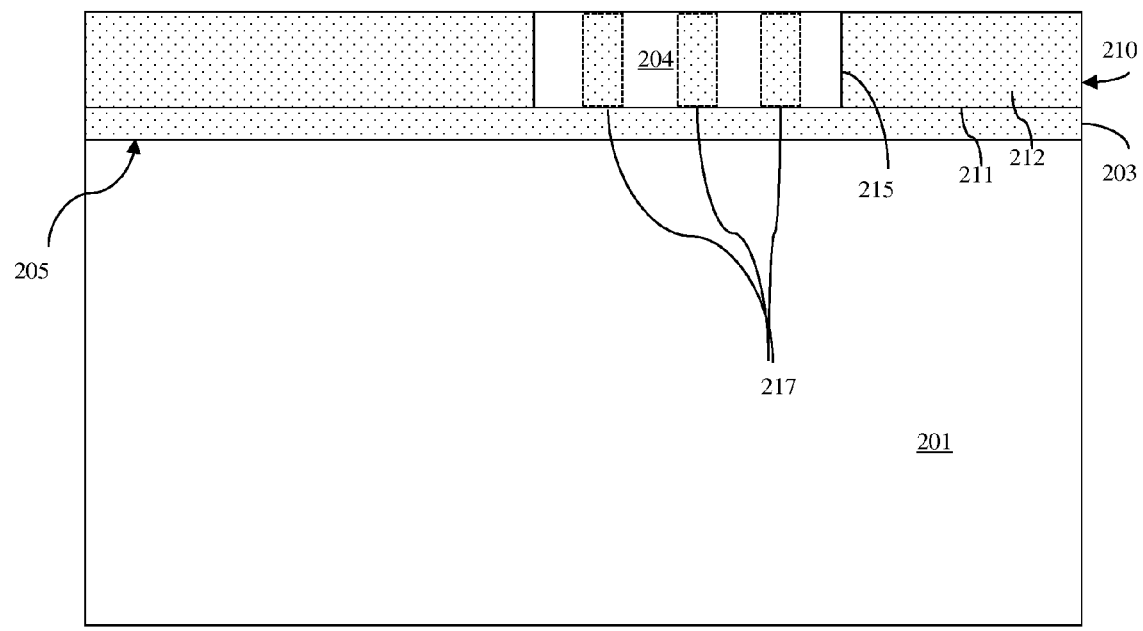
FIG. 13 is a cross-section illustration of a partially completed semiconductor structure formed according to the method of FIG. 12.

The method can further comprise forming a first trench isolation region 210 in the semiconductor layer (1204, see FIG. 13). To form the first trench isolation region 210, a first trench 211 can be formed (e.g., lithographically patterned and etched) through the semiconductor layer. This first trench 211 can subsequently be filled with one or more first isolation materials 212 (e.g., silicon dioxide, silicon nitride, silicon oxynitride, and/or any other suitable isolation material). It should be noted that the first trench 211 can be patterned and etched such that the resulting first trench isolation region 210 has a first opening 215 extending vertically there through and such that a portion 204 of the semiconductor layer is within the first opening 215 laterally surrounded by the first trench isolation region 210. Thus, the shape of the first opening 215 of the first trench isolation region 210 defines the shape of this portion 204 of the semiconductor layer. This first opening 215 can, for example, be an essentially rectangular-shaped first opening.

Optionally, during the process of forming the first trench isolation region 210, which defines a portion 204 of the semiconductor layer, dielectric columns 217 can also be formed within the portion 204. That is, when the first trench 211 is lithographically patterned and etched, multiple vias can also be lithographically patterned and etch through the portion 204. When the first trench 211 is filled with the first isolation material(s), the vias can simultaneously be filled in order to form the dielectric columns.

Figure 14:
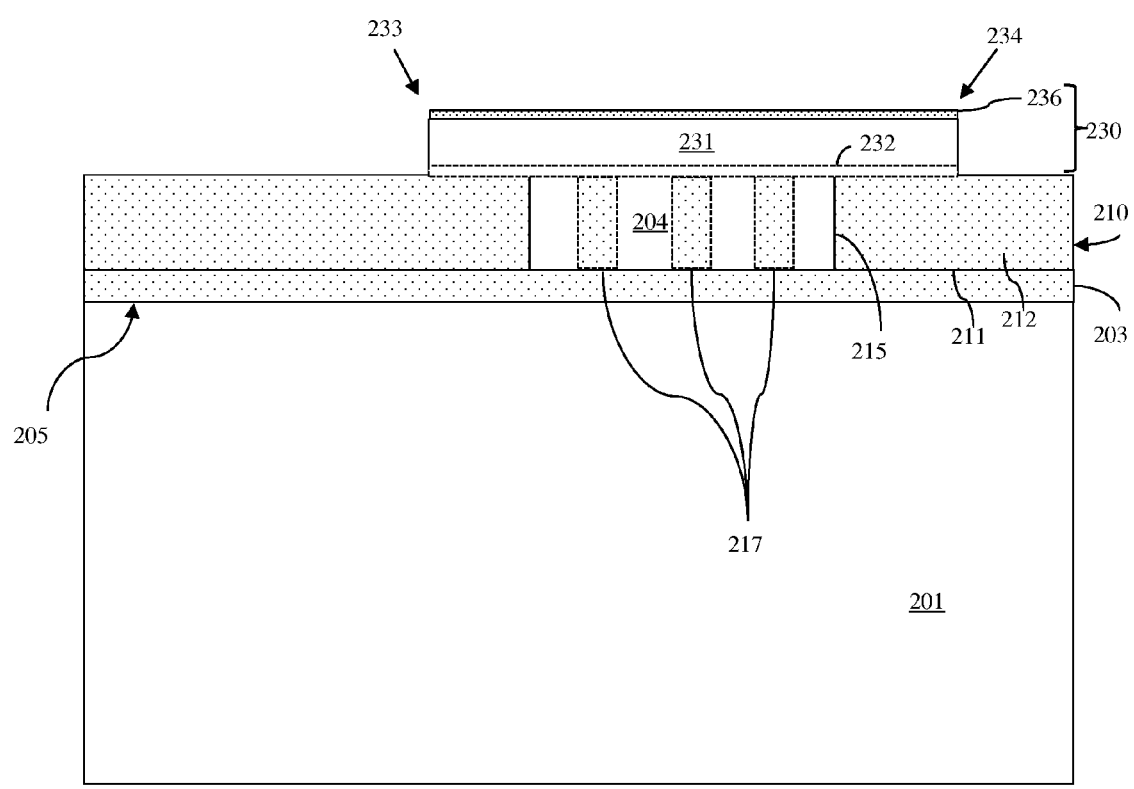
FIG. 14 is a cross-section illustration of a partially completed semiconductor structure formed according to the method of FIG. 12.

This method can further comprise forming a photodetector 230 on the portion 204 of the semiconductor layer within the first opening 215 (1206, see FIG. 14). Specifically, a light-absorbing layer 231 can be formed (e.g., epitaxially deposited) over the portion 204 of the semiconductor layer defined by the first trench isolation region 210 and further over the first trench isolation region 210. This light-absorbing layer 231 can comprise a light absorbing material and, particularly, a material that absorbs light (i.e., optical signals or photons) within predetermined wavelength bands. For example, this light-absorbing layer 231 can comprise a germanium layer (e.g., an epitaxial germanium layer) that absorbs light (i.e., optical signals or photons) in the infrared wavelength bands (i.e., wavelengths ($\lambda$) in the range of approximately 1.2µ to 1.7µ).). The germanium layer can be in-situ doped during epitaxial deposition (or subsequently doped) so as to have N-type conductivity, P-type conductivity, or alternating regions of N-type conductivity and P-type conductivity (e.g., to form a PN junction diode or a multitude of PN junctions within the germanium layer). The doping concentrations can range from 1e17 atoms/cm$^3$ to 1e21 atoms/cm$^3$ with preferable concentrations between 1e19 atoms/cm$^3$ to 1e20 atoms/cm$^3$. The doping profiles within the germanium layer can, for example, be constructed such that the peak concentration is located at the half-height of the germanium layer. Furthermore, the doping profiles within the germanium layer can be optimized to reduce dark current of the photodetector, while providing for high responsivity and high operation speed. In another example, the light-absorbing layer 131 can comprise a germanium-tin layer or any other suitable light-absorbing layer. Such light-absorbing layers can similar be doped so as to have N-type conductivity, P-type conductivity, or alternating regions of N-type conductivity and P-type conductivity. Optionally, prior to formation of the light-absorbing layer 231, a buffer layer 232 can be formed (e.g., epitaxially deposited) and, following formation of the light-absorbing layer 231, a dielectric cap layer 236 can be formed (e.g., deposited). The buffer layer 232 can comprise, for example, a silicon germanium layer (e.g., an epitaxially deposited silicon germanium layer) that facilitates subsequent epitaxial deposition of a germanium light-absorbing layer. The dielectric cap layer 236 can comprise, for example, a silicon nitride cap layer or other suitable dielectric cap layer. Those skilled in the art will recognize that if the above-described optional buffer layer 232 and light-absorbing layer 231 are formed by epitaxial deposition, such processes are typically followed by an anneal. In any case, the light-absorbing layer 231 and, if applicable, the buffer layer 232 and dielectric cap layer 236 can subsequently be lithographically patterned and etched to form the photodetector 230 such that the photodetector 230 is aligned above the first opening 215 and is slightly larger than the first opening 215 so as to extend laterally onto the first trench isolation region 210. The resulting photodetector 230 can, for example, have essentially the same shape as the first opening 215 (e.g., an essentially rectangular shape) with a first end 233, a second end 234 opposite the first end 233, and opposing sides.

It should be noted that the photodetector 230 can specifically be formed at process 1206 so that its height 239 will be less than the diameter 259 of a core 251 of an optical fiber 250 to which it will be coupled in the resulting semiconductor structure 200 (see FIG. 2A). Alternatively, the photodetector 230 can specifically be formed at process 1206 so that its height 239 will be approximately equal to the diameter 259 of a core 251 of an optical fiber 250 to which it will be coupled in the resulting semiconductor structure 200 (see FIG. 4).

Figure 15:
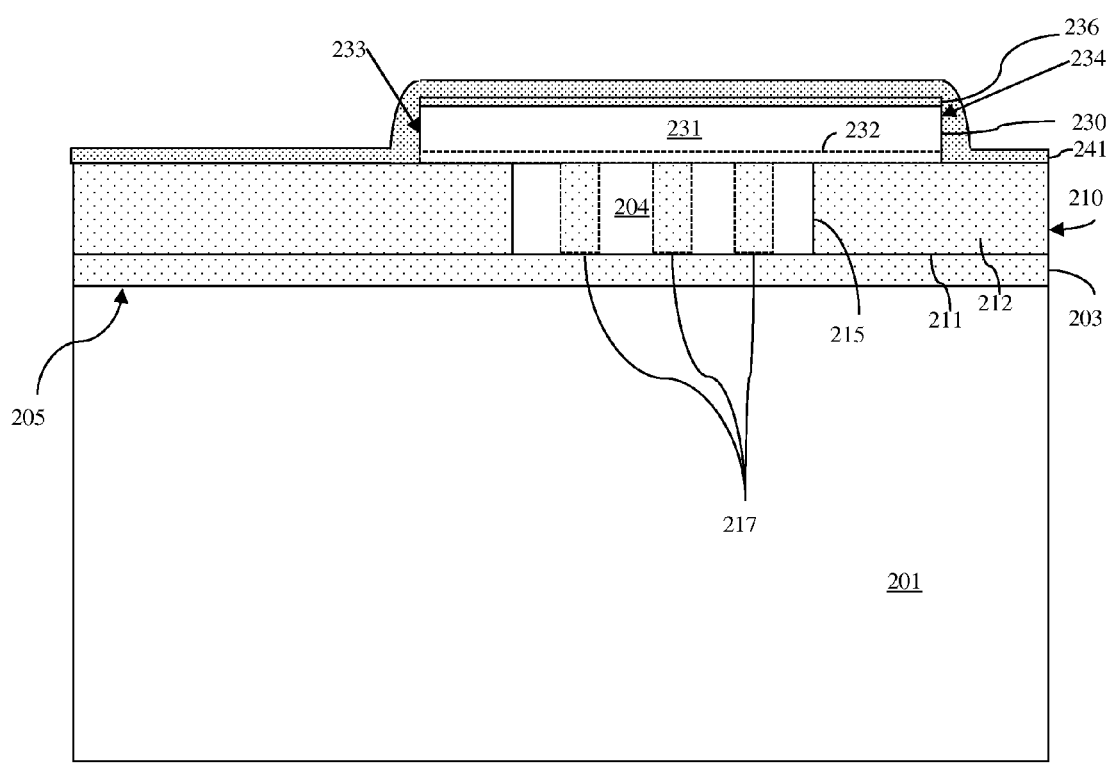
FIG. 15 is a cross-section illustration of a partially completed semiconductor structure formed according to the method of FIG. 12.

In any case, after forming the photodetector 230, a dielectric layer 241 can be formed (e.g., conformally deposited) such that it covers the photodetector 230 and further extends laterally onto the first trench isolation region 210 (1208, see FIG. 15). This dielectric layer 241 can comprise, for example, a silicon nitride layer, a silicon oxynitride layer or any other suitable semiconductor layer.

Figure 16A:
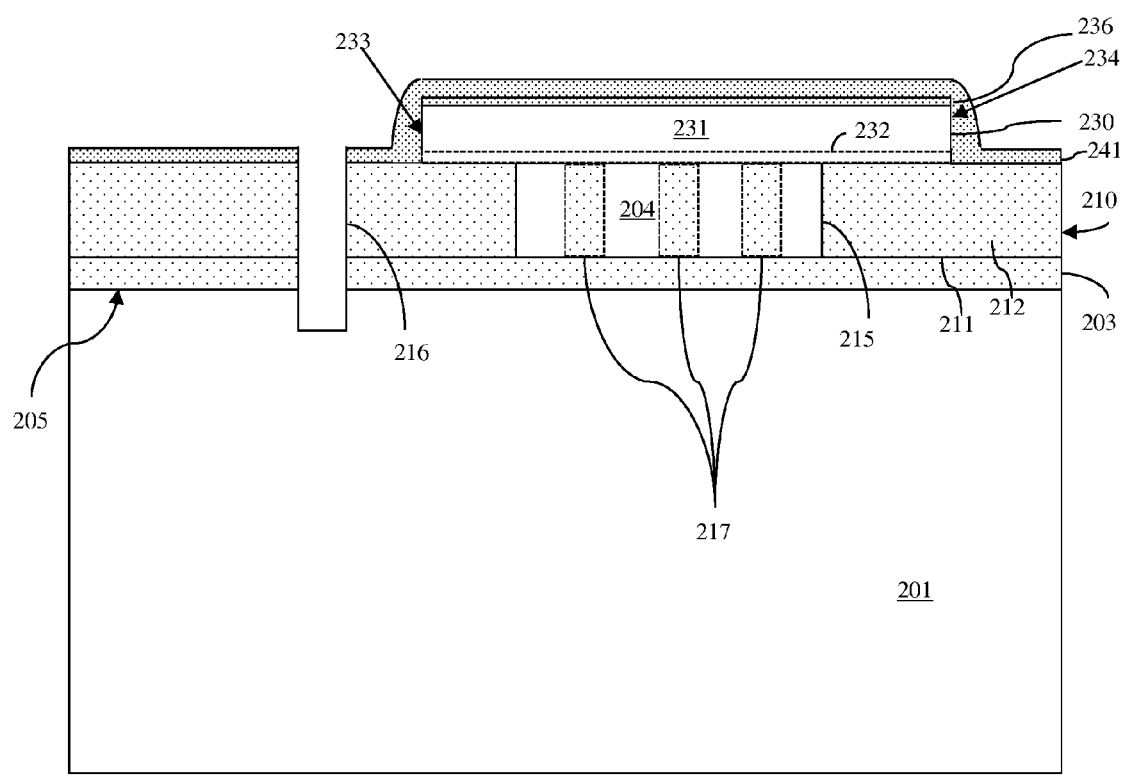
FIG. 16A is a cross-section illustration of a partially completed semiconductor structure formed according to the method of FIG. 12.
Figure 16B:
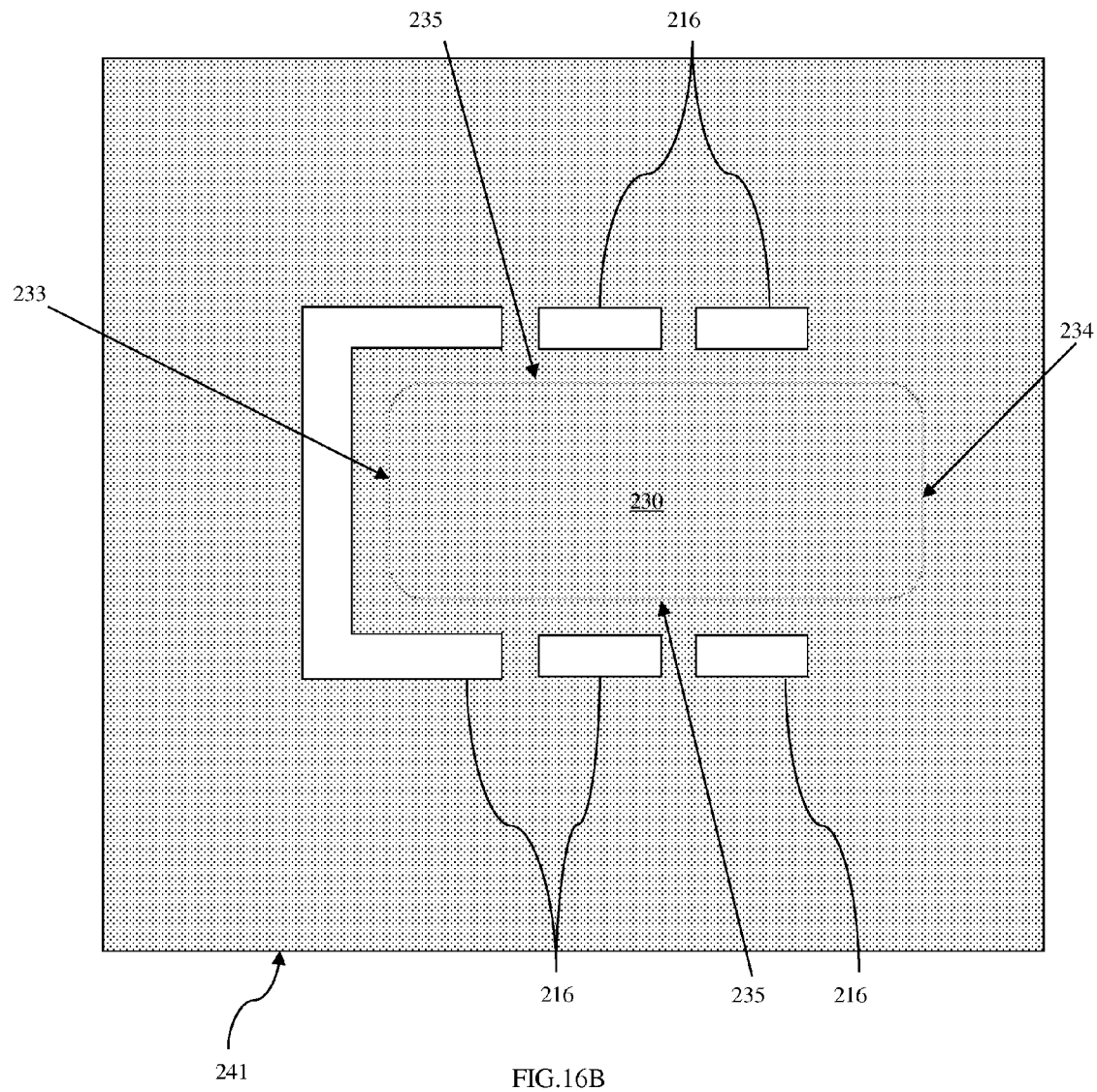
FIG. 16B is a top view diagram illustrating the partially completed semiconductor structure of FIG. 16A.
Figure 17:
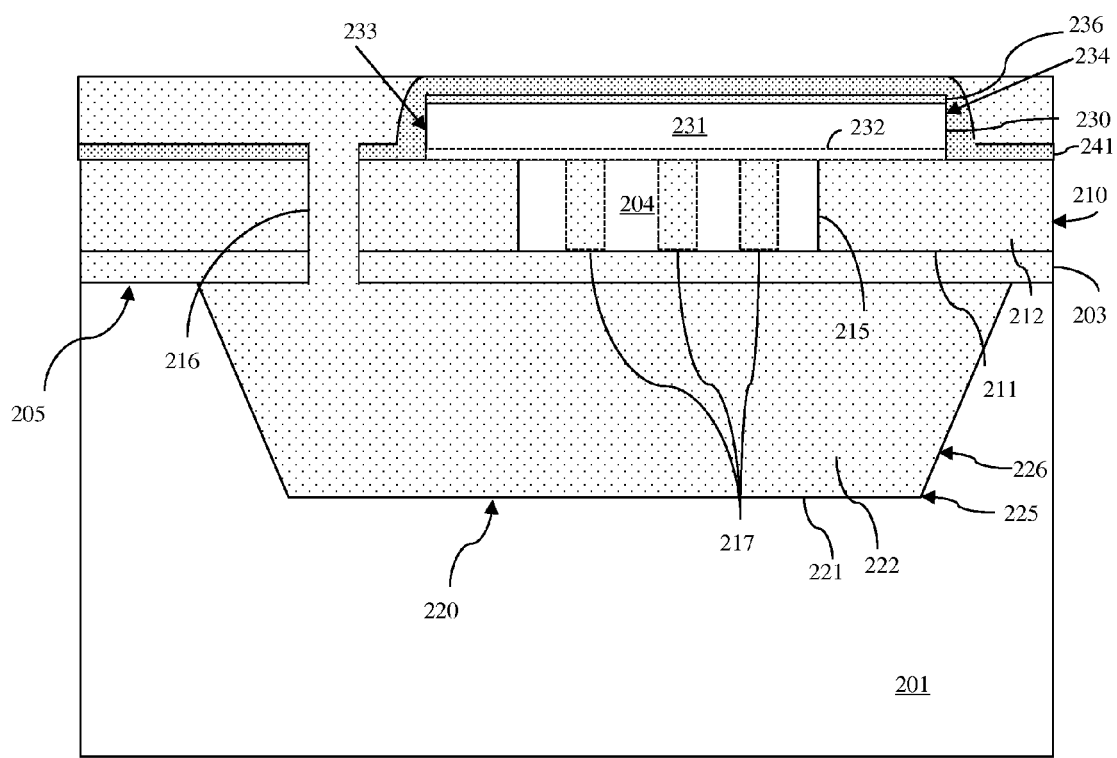
FIG. 17 is a cross-section illustration of a partially completed semiconductor structure formed according to the method of FIG. 12; and, FIG. 18 is a cross-section illustration of a partially completed semiconductor structure formed according to the method of FIG. 12.

Then, a second trench isolation region 220 can be formed in the semiconductor substrate 201 below the insulator layer 203 and, specifically, in the semiconductor substrate 201 aligned below the photodetector 230 and the first trench isolation region 210 (1210). Specifically, a plurality of second openings 216 can be formed (e.g., lithographically patterned and etched) such that they extend vertically through the dielectric layer 241, the first trench isolation region 210 and the insulator layer 203 and into the semiconductor substrate 201. These second openings 116 can further be formed (i.e., lithographically patterned and etched) such that they are positioned adjacent to multiple sides of the photodetector 230 and, particularly, adjacent to at least the first end 233 (i.e., the light-receiving end) and the opposing sides 235 of the photodetector 230 (see FIGS. 16A-16B). Once the second openings 216 are formed, exposed surfaces of the semiconductor substrate 201 in the lower sections of the second openings 216 can be etched until those lower sections are merged in order to form a second trench 221 in the semiconductor substrate 201 below the insulator layer 203 and this second trench 221 and the second openings 216 can then be filled with one or more second isolation material(s) 222 so as to form the second trench isolation region 220 aligned below the photodetector 230 and the first trench isolation region 210 (see FIG. 17). The second isolation material(s) 222 can comprise, for example, silicon dioxide, silicon nitride, silicon oxynitride and/or any other suitable isolation material. The second isolation material(s) 222 can be the same as or different from the first isolation material(s) 212.

The specifications for the above-described etch process used to form the second trench 221 should specifically be chosen so that the semiconductor material of the semiconductor substrate 201 will be selectively etched over the materials used for the dielectric layer 241, the first trench isolation region 210 and the insulator layer 203. For example, if the semiconductor substrate 201 comprises silicon, if the first isolation material 212 of the first trench isolation region 210 comprises silicon dioxide, if the insulator layer 203 comprises silicon dioxide and if the dielectric layer 241 comprises silicon nitride, the etch process used to form the second trench 221 can comprise a wet chemical etch process, which uses an etchant, such as tetramethylammonium hydroxide (TMAH), ammonium hydroxide ($NH_4OH$), ethylenediamine pyrocatechol (EDP), potassium hydroxide (KOH), or any other suitable etchant capable of etching silicon over the various dielectric and isolation materials. Those skilled in the art will recognize that alternative etchants could be used depending upon the chemical differences between the semiconductor substrate 201, the dielectric layer 241, the first isolation material(s) 212 of the first trench isolation region 210, and the insulator layer 203. Those skilled in the art will recognize that such wet chemical etch processes also typically exhibit etch selectivity along crystal planes (e.g., selectivity for silicon that is significantly higher in the [100] direction than in the [111] direction). As a result, the bottom surface 225 of the second trench 221 may remain essentially parallel to the top surface 205 of the semiconductor substrate 201, but the sidewalls 226 may be angled, as opposed to perpendicular, relative to the top surface 205 of the semiconductor substrate 201. It should be noted that remaining sections of the dielectric layer 241, insulator layer 203 and first trench isolation region 210 (e.g., between the second openings 216) as well as the adjacent substrate provide adequate support for the photodetector 230 during etching of the second trench 221 and prior to filling the second trench 221 with the second isolation material(s) 222.

Figure 18:
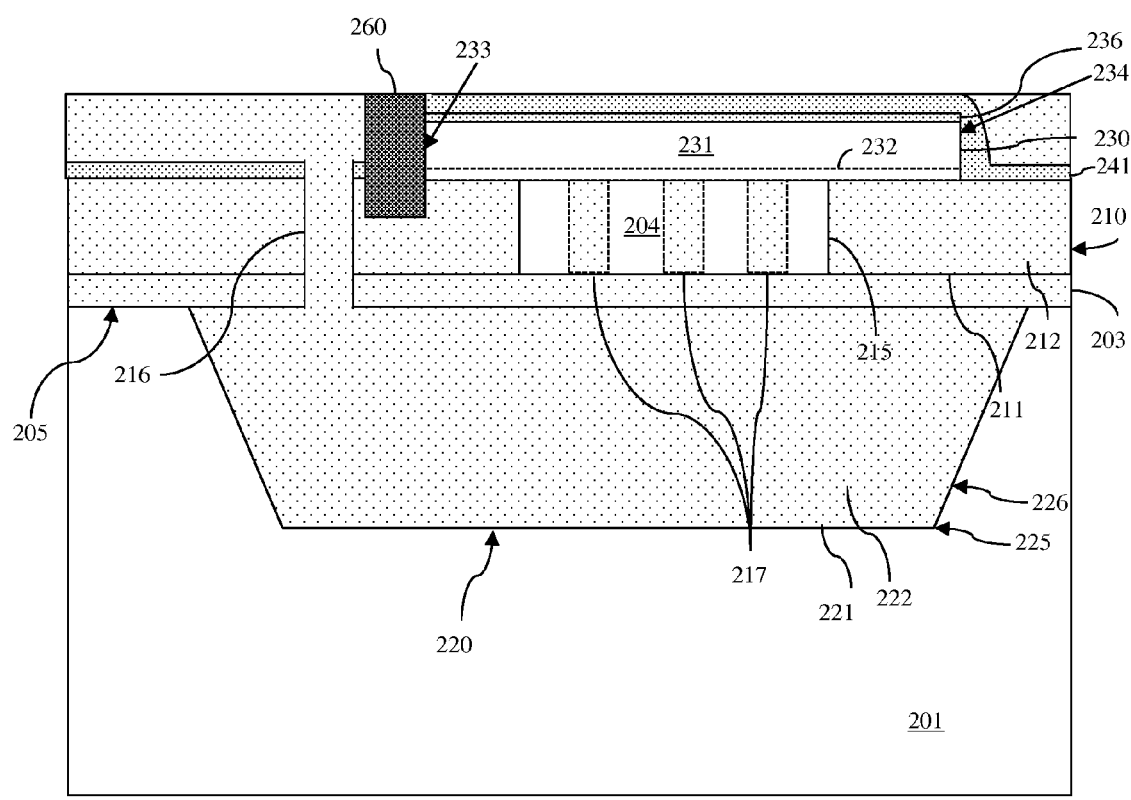

Next, an antireflective (AR) spacer 260 can be formed such that it is positioned laterally immediately adjacent to the first end 233 and, particularly, immediately adjacent to the light signal-receiving end of the photodetector 230 (1212, see FIG. 18). For example, a trench can be lithographically patterned and etched through the dielectric layer 241 and into the first trench isolation region 210 immediately adjacent to the first end 233 of the photodetector 230. This trench can subsequently be filled with an antireflective (AR) material in order to form the antireflective (AR) spacer 260. The antireflective (AR) material can comprise, for example, titanium nitride or any other suitable antireflective material. This antireflective (AR) spacer 260 should be formed at process 1212 so as to have a quarter-wave thickness or multiple thereof. That is, the thickness of the antireflective (AR) spacer can be ¼ the wavelength of the optical signals, which are intended to be transmitted to and captured by the photodetector 230.

Following formation of the antireflective (AR) spacer 260, back end of the line (BEOL) processing can be performed in order to form contacts and other interconnects (e.g., wires and vias) in one or more additional dielectric layers 242 (i.e., interlayer dielectrics such as, silicon dioxide, silicon nitride, silicon oxynitride, borophosphosilicate glass (BPSG), etc.) above the dielectric layer 241 in order to electrically connect the photodetector 230 to one or more other on-chip devices (1214, see FIGS. 2A-2C). Additionally, an edge 290 of the semiconductor substrate 201 adjacent to the first end 233 of the photodetector 230 can be prepared for receiving an off-chip optical fiber 250 so that optical fiber 250 can be coupled to the photodetector 230 (1216, see FIGS. 2A-2C). As mentioned above with regard to the semiconductor structure 200, an optical fiber 250 can comprise a core 251 and cladding 252 around this core 251. Both the core 251 and the cladding 252 can comprise light-transmissive materials; however, the core material(s) can have a refractive index that is higher than that of the cladding material(s) so that light signals can be confined to and propagated along the core. To prepare the edge 290 of the semiconductor substrate 201 for receiving an optical fiber 250, this edge 290 can be exposed (e.g., using a masked etch process) such that it extends laterally beyond the first end 233 of the photodetector 230, the antireflective (AR) spacer 260, the first trench isolation region 210, the insulator layer 203 and the second trench isolation region 220. Then, a groove (e.g., a V-groove) for receiving the optical fiber 250 can be formed (e.g., lithographically patterned and etched) on the exposed edge 290 such that it is aligned the photodetector 230.

After the edge 290 of the semiconductor substrate 201 is prepared for receiving an optical fiber, as described above, one end of an optical fiber 250 can be positioned within the groove adjacent to the antireflective (AR) spacer 260 such that it is in end-to-end alignment with the first end 233 of the photodetector 230 and, thereby such that it is optically coupled to the photodetector 230 (1218, see FIGS. 2A-2C). Once the optical fiber 250 is coupled to the photodetector 230 in this manner, the optical fiber 250 can transmit optical signals to the photodetector 230 and the photodetector 230 can convert those the optical signals into electrical signals, which can, in turn, be transmitted to one or more other on-chip devices through the contacts and interconnects described above. During transmission of the optical signals from the optical fiber 250 to the photodetector 230, the isolation material that is below the photodetector 230 (e.g., in the stacked trench isolation regions, including the first trench isolation region 210 and the second trench isolation region 220, as well as in the insulator layer 203) can prevent optical signal loss into the semiconductor substrate 201.

Furthermore, in the semiconductor structure 200 of FIGS. 2A-2C the optional dielectric columns 217 can be used to minimize optical signal loss into the portion 204 of the semiconductor layer defined by the first trench isolation region 210.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are semiconductor structures and methods of forming the semiconductor structures. The semiconductor structures each have a photodetector that is optically and electrically isolated from a semiconductor substrate below by stacked trench isolation regions. Specifically, one semiconductor structure can comprise a first trench isolation region in and at the top surface of a bulk semiconductor substrate and a second trench isolation region in the substrate below the first trench isolation region. A photodetector can be on the top surface of the semiconductor substrate aligned above the first and second trench isolation regions. Another semiconductor structure can comprise a semiconductor layer on an insulator layer and laterally surrounded by a first trench isolation region. Additionally, a second trench isolation region can be in a semiconductor substrate below the first trench isolation region and insulator layer. A photodetector can be on the semiconductor layer and can extend laterally onto the first trench isolation region. In each of these semiconductor structures, the first and second trench isolation regions (i.e., the stacked trench isolations) can provide sufficient isolation below the photodetector to allow for direct coupling with an off-chip optical device (e.g., optical fiber) with minimal optical signal loss through semiconductor substrate.

What is claimed is:

1. A semiconductor structure comprising:
   a semiconductor substrate having a top surface;
   a first trench isolation region in said semiconductor substrate at said top surface, said first trench isolation region having a first opening;
   a photodetector above said first trench isolation region, the photodetector having at least one layer extending laterally across said first opening so as to have portions immediately adjacent to a top surface of the first trench isolation region on opposite sides of said first opening; and,
   a second trench isolation region in said semiconductor substrate aligned below said photodetector and said first opening in said first trench isolation region, said first opening extending vertically between said photodetector and said second trench isolation region, said first opening having an upper portion adjacent to said photodetector and filled with semiconductor material and a lower portion adjacent to said second trench isolation region and filled with isolation material.

2. The semiconductor structure of claim 1, said photodetector comprising a light-absorbing layer comprising any of a germanium layer and a germanium-tin layer.

3. The semiconductor structure of claim 2, said photodetector further comprising a buffer layer between said semiconductor substrate and said light-absorbing layer.

4. The semiconductor structure of claim 1, further comprising:
   a dielectric layer on said photodetector and further extending laterally onto said first trench isolation region; and,
   a plurality of second openings extending vertically through said dielectric layer and said first trench isolation region to said second trench isolation region, said second openings being positioned adjacent to multiple sides of said photodetector and being filled with said isolation material.

5. The semiconductor structure of claim 1, said photodetector having a first end and a second end opposite said first end and said semiconductor structure further comprising:
   an antireflective spacer positioned laterally adjacent to said first end; and,
   an optical fiber on said semiconductor substrate and in end-to-end alignment with said first end of said photodetector, said antireflective spacer being positioned laterally between said optical fiber to said photodetector, said optical fiber transmitting optical signals to said photodetector, and said first trench isolation region and said second trench isolation region preventing loss of said optical signals into said semiconductor substrate during said transmitting of said optical signals by said optical fiber.

6. The semiconductor structure of claim 5, said optical fiber comprising a core and cladding around said core, said photodetector having a height that is any one of less than a diameter of said core and approximately equal to said diameter of said core.

7. A semiconductor structure comprising:
a semiconductor substrate having a top surface;
a first trench isolation region in said semiconductor substrate at said top surface;
a photodetector above said first trench isolation region; and,
a second trench isolation region in said semiconductor substrate aligned below said photodetector and said first trench isolation region,
said first trench isolation region having a first opening that extends vertically between said photodetector and said second trench isolation region, said first opening having an upper portion adjacent to said photodetector and filled with semiconductor material and a lower portion adjacent to said second trench isolation region and filled with isolation material.

8. The semiconductor structure of claim 7, said photodetector comprising a light-absorbing layer comprising any of a germanium layer and a germanium-tin layer.

9. The semiconductor structure of claim 8, said photodetector further comprising a buffer layer between said semiconductor substrate and said light-absorbing layer.

10. The semiconductor structure of claim 7, further comprising:
a dielectric layer on said photodetector and further extending laterally onto said first trench isolation region; and,
a plurality of second openings extending vertically through said dielectric layer and said first trench isolation region to said second trench isolation region, said second openings being positioned adjacent to multiple sides of said photodetector and being filled with said isolation material.

11. The semiconductor structure of claim 7, said photodetector having a first end and a second end opposite said first end and said semiconductor structure further comprising:
an antireflective spacer positioned laterally adjacent to said first end; and,
an optical fiber on said semiconductor substrate and in end-to-end alignment with said first end of said photodetector, said antireflective spacer being positioned laterally between said optical fiber to said photodetector,
said optical fiber transmitting optical signals to said photodetector, and
said first trench isolation region and said second trench isolation region preventing loss of said optical signals into said semiconductor substrate during said transmitting of said optical signals by said optical fiber.

12. The semiconductor structure of claim 11, said optical fiber comprising a core and cladding around said core, said photodetector having a height that is any one of less than a diameter of said core and approximately equal to said diameter of said core.

13. A semiconductor structure comprising:
a semiconductor substrate having a top surface;
a first trench isolation region in said semiconductor substrate at said top surface;
a photodetector above said first trench isolation region, said photodetector having a first end and a second end opposite said first end;
a second trench isolation region in said semiconductor substrate aligned below said photodetector and said first trench isolation region;
an antireflective spacer positioned laterally adjacent to said first end; and,
an optical fiber on said semiconductor substrate and in end-to-end alignment with said first end of said photodetector,
said antireflective spacer being positioned laterally between said optical fiber to said photodetector,
said optical fiber transmitting optical signals to said photodetector, and
said first trench isolation region and said second trench isolation region preventing loss of said optical signals into said semiconductor substrate during said transmitting of said optical signals by said optical fiber.

14. The semiconductor structure of claim 13, said photodetector comprising a light-absorbing layer comprising any of a germanium layer and a germanium-tin layer.

15. The semiconductor structure of claim 14, said photodetector further comprising a buffer layer between said semiconductor substrate and said light-absorbing layer.

16. The semiconductor structure of claim 13, said first trench isolation region having a first opening that extends vertically between said photodetector and said second trench isolation region, said first opening being at least partially filled with isolation material.

* * * * *